(12) United States Patent
Wright

(10) Patent No.: US 6,570,444 B2
(45) Date of Patent: May 27, 2003

(54) LOW NOISE WIDEBAND DIGITAL PREDISTORTION AMPLIFIER

(75) Inventor: Andrew S. Wright, Vancouver (CA)

(73) Assignee: PMC-Sierra, Inc., Burnaby (CA)

( * ) Notice: Subject to any disclaimer, the term of this patent is extended or adjusted under 35 U.S.C. 154(b) by 0 days.

(21) Appl. No.: 09/770,568

(22) Filed: Jan. 26, 2001

(65) Prior Publication Data

US 2001/0054974 A1 Dec. 27, 2001

Related U.S. Application Data

(60) Provisional application No. 60/178,223, filed on Jan. 26, 2000.

(51) Int. Cl.[7] .................................................. H03F 1/26
(52) U.S. Cl. ........................................ 330/149; 375/297
(58) Field of Search ........................ 330/149; 375/297, 375/296

(56) References Cited

U.S. PATENT DOCUMENTS

| | | | | |
|---|---|---|---|---|
| 4,291,277 A | * | 9/1981 | Davis et al. | 375/297 |
| 5,699,383 A | * | 12/1997 | Ichiyoshi | 330/149 |
| 5,748,678 A | * | 5/1998 | Valentine et al. | 330/149 |
| 5,825,829 A | * | 10/1998 | Borazjani et al. | 375/222 |
| 5,959,499 A | * | 9/1999 | Khan et al. | 330/149 |
| 6,091,941 A | * | 7/2000 | Moriyama et al. | 330/149 |
| 6,240,144 B1 | * | 5/2001 | Ha | 375/297 |
| 6,304,596 B1 | * | 10/2001 | Yamano et al. | 375/222 |

* cited by examiner

*Primary Examiner*—Robert Pascal
*Assistant Examiner*—Khanh Van Nguyen
(74) *Attorney, Agent, or Firm*—Knobbe, Martens, Olson & Bear LLP

(57) ABSTRACT

A digital predistortion amplifier design compensates for non-linear amplification of an input signal using predistortion techniques. The design provides a reduced noise floor by using separate digital to analog converters (DAC) to separately convert the input signal and an error correction signal. Furthermore, the input signal can be separated into two or more subbands of narrower bandwidth. Each of the subbands are converted to analog using a separate DAC. By reducing the power and/or bandwidth to be handled by any one DAC, the available levels of quantization of the DAC are applied to a lower power signal and therefore the signal to noise ratio resulting from the conversion process is improved. In addition, each digital subband is passed through a correction filter, which is driven by an adaptive control processing and compensation estimator to compensate for relative gain, phase, and delay inconsistencies between the different subbands.

32 Claims, 22 Drawing Sheets

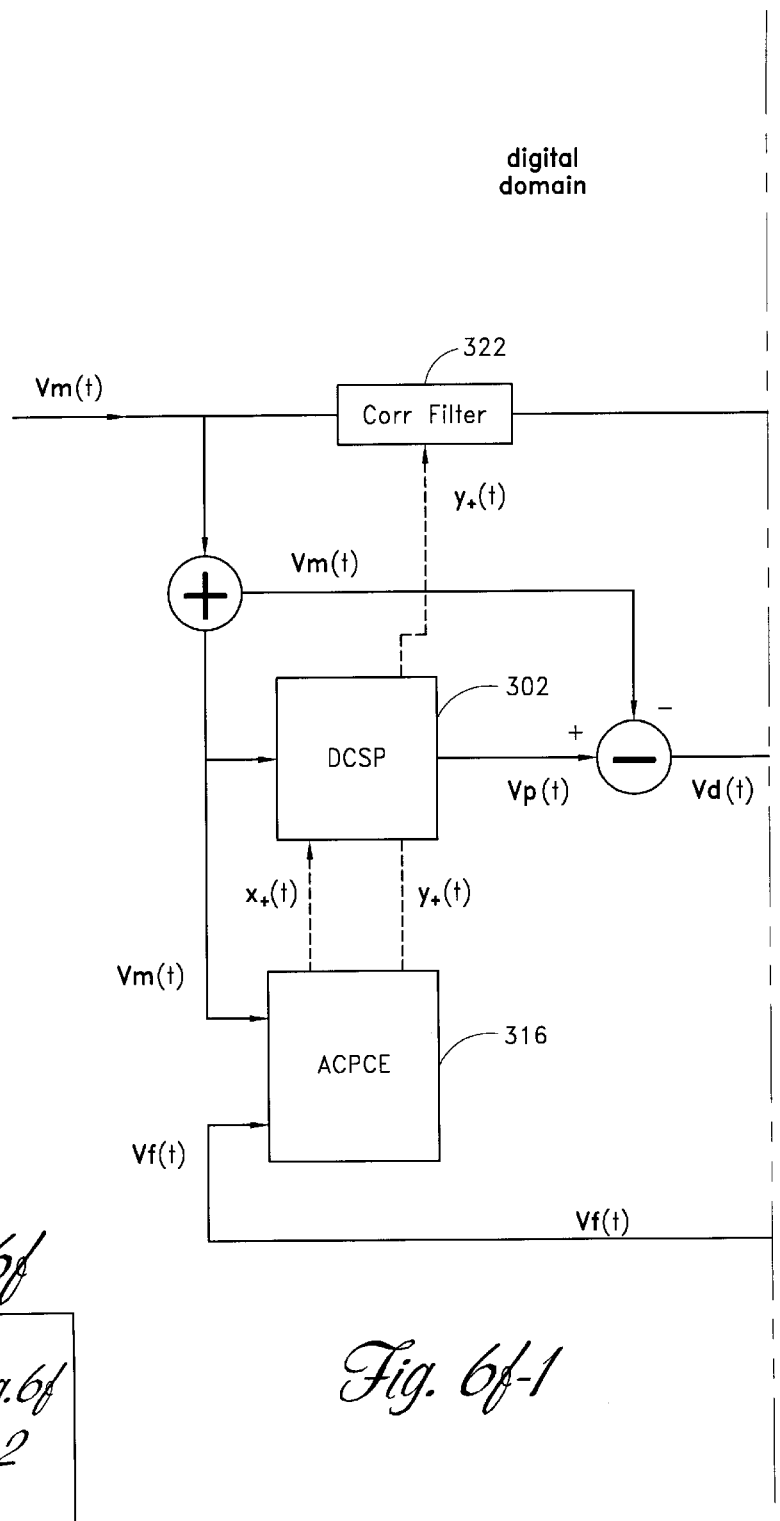
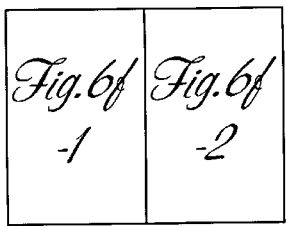
Fig. 6f-1
Fig. 6f
Fig.6f-1 | Fig.6f-2

LOW NOISE WIDEBAND DIGITAL PREDISTORTION AMPLIFIER

PRIORITY INFORMATION

This application claims the benefit of U.S. Provisional Application No. 60/178,223, filed on Jan. 26, 2000, for "A LOW NOICE WIDEBAND DIGITAL PREDISTORTION AMPLIFIER," which is hereby incorporated by reference.

BACKGROUND OF THE INVENTION

1. Field of the Invention

This invention relates generally to radio frequency power amplifiers and, more particularly, the invention relates to methods of managing the signal to noise floor ratio as the operational bandwidth of a digital linearized predistortion amplifier is expanded.

2. Description of the Related Art

Radio frequency power amplifiers are widely used to transmit signals in communications systems. Typically a signal to be transmitted is concentrated around a particular carrier frequency occupying a defined channel. Information is sent in the form of modulation of amplitude, phase, and/or frequency such that the information is represented by energy spread over a band of frequencies around the carrier frequency. In many schemes the carrier itself is not sent since it is not essential to the communication of the information.

When a signal that contains amplitude variations is amplified, it will suffer distortion if the amplifier does not exhibit a linear amplitude and phase transfer characteristic. This means that the output is not linearly proportional to the input. The signal will also suffer distortion if the phase shift, which the amplifier introduces, is not linear over the range of frequencies present in the signal or if the phase shift caused by the amplifier varies with the amplitude of the input signal. The distortion introduced typically includes intermodulation of the components of the input signal. The products of the intermodulation appear within the bandwidth of the signal causing undesirable interference. The products of the intermodulation also extend outside the bandwidth originally occupied by the signal. This can cause interference in adjacent channels and violate transmitter licensing and regulatory spectral emission requirements. Although filtering can be used to remove the unwanted out of band distortion, this is not always practical, especially if the amplifier is required to operate on several different frequencies.

Distortion products that occur at multiples of the carrier frequency can also be produced in a non-linear amplifier, but are relatively easy to remove by filtering. Intermodulation is also a problem when multiple signals are amplified in the same amplifier even if individually they do not have amplitude variations. This is because the combination of the multiple signals produces amplitude variations as the various components beat with each other by adding and subtracting as their phase relationships change.

Amplifiers can introduce some distortion even if they are well designed. Perfect linearity over a wide range of amplitude is difficult to realize in practice. In addition, as any amplifier nears its maximum output power capacity, the output no longer increases as the input increases. At this point the amplifier is not regarded as linear. A typical amplifier becomes significantly non-linear at a small fraction of its maximum output capacity. This means that in order to maintain linearity, the amplifier is often operated at an input and output amplitude which is low enough that the signals to be amplified are in a part of its transfer characteristic that is substantially linear. This is a method of operation, described as "backed off," in which the amplifier has a low supplied power to transmitted power conversion efficiency. A "Class A" amplifier operating in this mode may be linear enough for transmitting a signal cleanly but might typically be only 1% efficient. This wastes power and means that the amplifier has to be large and relatively expensive. In addition, the wasted power is dissipated as heat, which generally must be removed by cooling means.

Communication schemes using signals which have constant amplitude with frequency and phase modulation can use highly non-linear amplifiers. These types of signals are unaffected by the distortion and the amplifiers can be smaller, cooler, more power efficient and less expensive. Modulation of this type is used in conventional radio paging systems, which use CPFSK modulation.

Many of the newer, bandwidth efficient modulation schemes have both amplitude and phase variations. There is also frequently a desire to be able to transmit multiple signals on different channels through a single amplifier. This reduces the number of separate amplifiers required and avoids the need for large and costly high level output signal combining filters, which have undesirable power losses.

There is a need for linear amplifiers which are compact, power efficient and inexpensive. Linearized amplifiers can be made by correcting for the non-linearities of amplifiers using methods such as Cartesian feedback, predistortion, and feedforward correction.

Cartesian feedback is a method in which a monitoring system looks at the output of the amplifier and attempts to alter the input of the amplifier so that it produces the intended output. This is accomplished using a direct feedback loop. The delay in the feedback path can cause the input signal to be modified too slowly to provide effective compensation, especially with signals at higher bandwidths.

The traditional predistortion method attempts to correct for the non-linear transfer characteristic of an amplifier by forming an inverse model of its transfer characteristic. This characteristic is applied to the low level signal at the input of the amplifier in a nonlinear memory-less function to predistort the signal such that the amplified signal appears substantially undistorted. This method is capable of excellent results over a relatively small bandwidth. The non-linear memory-less function is updated to account for variations in the amplifier transfer characteristic and this is done by monitoring the output and periodically updating the correction parameters. The non-linear coefficients of the memory-less function may be changed as often as every sample using the values stored in memory.

Feedforward is a method that derives a signal which represents the inverse of the distortions produced by the amplifier. This can be done by comparing the amplifier input and output to extract a distortion signal. A small linear amplifier is used to amplify the distortion signal. The amplified distortion signal is then subtracted from the main amplifier output. This method gives good results over a relatively wide bandwidth. However, balancing the amplitude and delay of the distortion signal so that it cancels the main amplifier errors exactly is difficult to implement.

Both traditional feedforward and predistortion are widely used in commercial products which can amplify multiple signals and operate over a wide range of amplitudes. Both methods are quite complex and the power efficiencies are still not excellent. Feedforward amplifiers are typically only 5% efficient. The complicated processing requirements add to the cost and the power used and significant cooling capacity is still required to remove waste heat. Predistortion is capable of excellent results, but only over a relatively small bandwidth.

SUMMARY OF THE INVENTION

The present invention provides methods of managing the signal to noise floor ratio exhibited in individual subbands as the operational bandwidth of a digital linearized predistortion amplifier is expanded.

In one aspect of the invention, a digital input signal is separated into subbands of lower bandwidth. The digital input signal is preferably a wideband signal that has one or both of the following characteristics: (a) the signal exists at one or more frequencies within an operating bandwidth within a time interval that is the reciprocal of the total information bandwidth; (b) the signal consists of multiple information bearing subcarriers and has a spectral occupancy that exceeds 0.1% of the RF carrier frequency. Each of the digital subband signals, which has a lower power than the digital input signal, is separately converted to an analog subband signal using a separate DAC. The separately converted analog subband signals are combined to form an analog input signal. By separating the digital signal into subbands, separate DACs can be used and the power of the signal to be handled by any one DAC is reduced.

In another aspect of the invention, a digital correction signal is created by taking the difference between a digital predistortion signal and the digital input signal. The digital predistortion signal, which is a signal that is typically passed through a Digital to Analog Converter (DAC) and supplied to a non-linear amplifier, can be created using presently available techniques. In accordance with the invention, however, the digital input signal is removed from the digital predistortion signal to leave only the digital correction signal, which has a much lower power than the digital predistortion signal. The digital correction signal and the digital input signal (or its subbands) are separately converted to analog signals using separate DACs. The converted analog signals are combined by analog summation to form an analog predistorted signal. The analog predistorted signal is passed on to a non-linear amplifier.

The aforementioned aspects of the invention result in the separation of a digital signal into separate signals of lower power. In the prior art, a single DAC has been used to convert a combined signal of much higher power. In accordance with the present invention, however, multiple DACs are employed and each DAC converts a digital signal of a lower power. As a result, the available levels of quantization of each DAC are applied to a lower power signal and the lower power per quantum ratio provides a better signal to noise ratio. Accordingly, substantially the entire dynamic range of each DAC can be used to convert a signal to analog form.

In another aspect of the invention, each analog signal is passed through a separate narrow band reconstruction filter before the analog signals are combined. Each reconstruction filter can be configured specifically for a narrow frequency range. By passing each converted signal through a separate narrow reconstruction filter, a significantly higher signal to wideband noise ratio for the composite signal can be achieved. The use of separate reconstruction filters, however, may introduce relative gain, phase, and delay inconsistencies between the separate signals. These relative inconsistencies are caused by the analog nature of the reconstruction filters, which are preferably configured to handle specific narrow frequency bands.

In order to correct the relative inconsistencies between the separate signals, a digital correction filter is introduced in-line along each subband signal path before the DAC. The correction filters are driven by an Adaptive Control Processing and Compensation Estimator (ACPCE) block, which adaptively generates compensation parameters for the filters based on observations of the digital input signal and the output of the amplifier.

In each block diagram, all signal processing functions and signals depicted on the left side of the vertical "digital/analog domain" dashed line are digital, and all signal processing functions and signals on the right side are analog.

DETAILED DESCRIPTION OF THE EMBODIMENTS

In the following description, reference is made to the accompanying drawings, which form a part hereof, and which show, by way of illustration, specific embodiments or processes in which the invention may be practiced. Where possible, the same reference numbers are used throughout the drawings to refer to the same or functionally similar components. In some instances, numerous specific details are set forth in order to provide a thorough understanding of the present invention. The present invention, however, may be practiced without the specific details or with certain alternative equivalent devices, components, and methods to those described herein. In other instances, well-known devices, components, and methods have not been described in detail so as not to unnecessarily obscure aspects of the present invention.

I. PROBLEM STATEMENT

The North American digital cellular telephony services employ linear modulation schemes to encode baseband information in both the amplitude and phase of a radio frequency (RF) carrier. This is undertaken to achieve an increase in spectral efficiency. If significant intermodulation and distortion products are to be avoided, class A linear amplifiers should be employed. These are generally inefficient and undesirable in systems where cost and heat dissipation are prohibitive factors. To avoid the compromise of constraints between the regulatory spectral emission mask and amplifier efficiency, attempts have been made to harness the efficiency of nonlinear class AB amplifiers by various digital linearization techniques. These techniques usually involve utilizing a digital to analog converter to drive the modulators in the upconversion circuitry with both the desired modulation signal and the correction signal all embedded within a single complex or real data stream.

Figure 1:
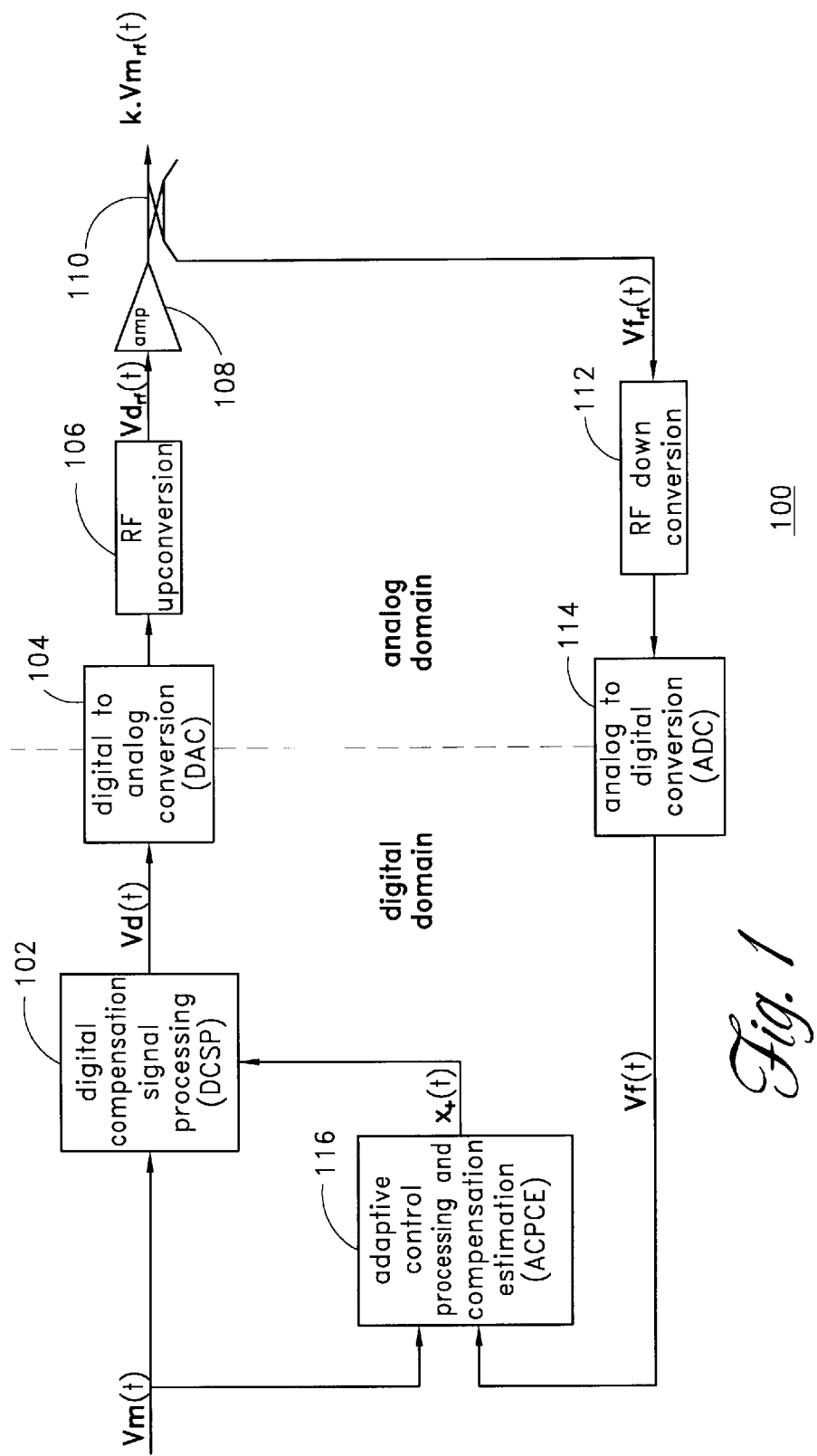
FIG. 1 illustrates the overall design of a typical amplifier system that uses predistortion to compensate for non-linearities in the amplification process.

FIG. 1 illustrates the overall design of a typical amplifier system 100 that uses predistortion to compensate for non-linearities in the amplification process. The amplifier design includes the following components: a Digital Compensation Signal Processing (DCSP) block 102, a generalized digital to analog conversion (DAC) block 104, an RF up conversion chain 106, a nonlinear amplifier (or amplifier assembly containing multiple nonlinear amplifiers) 108, an amplifier sampling structure (e.g., a Lange, Hybrid or Quadrature coupler) 110, an RF down conversion chain 112, a generalized analog to digital conversion (ADC) block, 114 and an Adaptive Control Processing and Compensation Estimator (ACPCE) block 116.

The basic objective of the predistorter design is to digitally compensate an input signal, Vm(t), such that after RF upconversion and amplification by a nonlinear amplifier 108, the output of the amplifier unit is a scaled replica of the input signal, k.Vm$_{rf}$(t). The degree of scaling is usually defined by the bulk amplifier's gain, k. To ensure that this goal is achieved, the input signal, Vm(t), is processed by the Digital Compensation Signal Processing (DCSP) block 102. This compensation processing is undertaken to correct for all upconversion linear imperfections and the nonlinearity of the amplifier. The compensation is undertaken such that the output signal from the Digital Compensation Signal Processing (DCSP) block 102, Vd(t), is distorted in a manner that is complementary, i.e., opposite in nature, to that incurred by the RF upconversion and amplification process. The complementary distortion is such that the composite of the distortion introduced by the Digital Compensation Signal Processing (DCSP) block 102 and by the RF upconversion and amplification processes effectively cancel each other resulting in a linearly amplified version, i.e., scaled, of the input signal Vm(t).

Successful operation of the Digital Compensation Signal Processing (DCSP) block 102 can only be achieved if the behavior of the external analog circuitry and all its linear and non-linear imperfections can be accurately predicted. Extraction of this information is the responsibility of the Adaptive Control Processing and Compensation Estimator (ACPCE) 116. The Adaptive Control Processing and Compensation Estimator (ACPCE) 116 operates by capturing digital samples of the input signal Vm(t) and the output, Vf(t), of the power amplifier unit 108. These samples are derived from the RF output signal k.Vm$_{rf}$(t), via the RF power sampling coupler 110 and down conversion circuits 112 which feed an intermediate frequency (IF) or baseband analog to digital converter (ADC) 114. The Adaptive Control Processing and Compensation Estimator (ACPCE) 116 computes the time delay difference between digital samples of the observed amplifier output and the ideal input signal. Once this has been achieved the Adaptive Control Processing and Compensation Estimator (ACPCE) 116 can accurately determine the update adjustment, if required, that is to be made to the correction coefficients that the Digital Compensation Signal Processing (DCSP) block 102 currently utilizes. Update adjustments are provided to the DCSP via a state parameter update vector x$_+$(t) that contains one or more sets of correction parameter updates.

One of the key problems associated with the aforementioned approach is that as the operational bandwidth of the design is expanded, the information bearing signal and correction signal also expand in bandwidth. Since the digital to analog converter (DAC) 104 can only source a finite signal power, the signal to noise ratio in any one subband becomes steadily lower as the signal sinks into the finite and fixed noise floor of the DAC 104, upconversion modulators, and RF circuitry 106.

Figure 2:
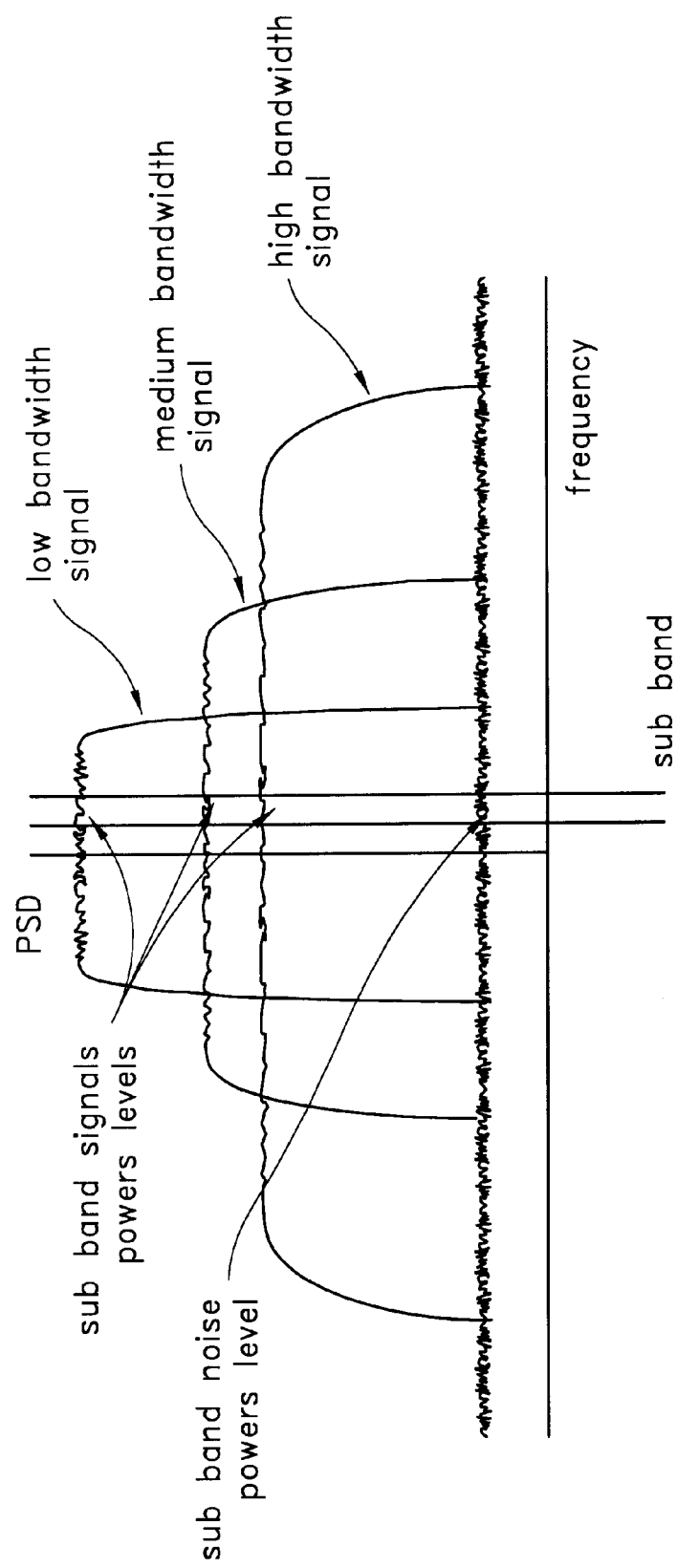
FIG. 2 illustrates how the noise floor generated by a digital to analog converter remains constant as the signal bandwidth expands.

FIG. 2 illustrates the aforementioned problem, where the noise floor generated by the DAC 104 remains constant as the signal bandwidth expands. As the signal bandwidth expands, the signal's subband to noise floor ratio steadily falls. This degradation causes current designs of digital linearized amplifiers, such as cartesian predistortion and digitally controlled feedforward designs, to be limited to a maximum bandwidth which currently does not exceed 5 MHz. The limitation is defined because the overall communications system requirement specifications often call for a minimum signal to noise performance ratio within any one subband. Currently, the problem is addressed by employing a single radio transceiver and amplifier for each subband.

The present invention overcomes the above problem by separating the wideband input signal into multiple subbands, precompensating or compensating the subbands, and then converting each subband to analog form using a subband-specific DAC. In addition, an analog correction signal is preferably generated by predistorting the entire wideband input signal, taking the difference between this predistorted signal and the input signal, and converting the result to analog form using still another DAC. The resulting analog signals are combined to form the input to the amplifier. Several embodiments of the invention are set forth below.

II. OVERVIEW

Figures 3, 3A:
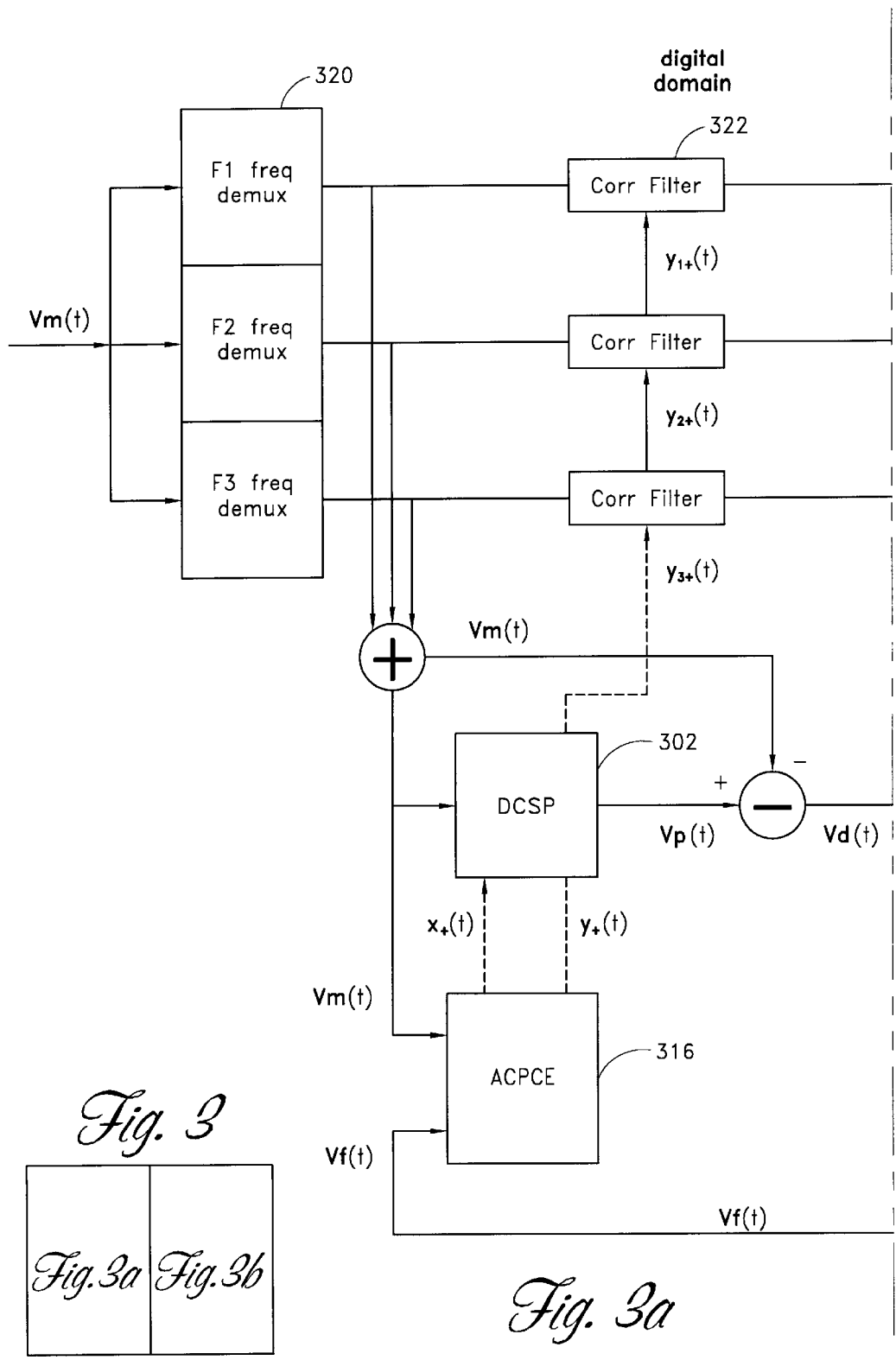
FIG. 3 illustrates an amplifier design in accordance with one embodiment of the invention.
Figure 3B:
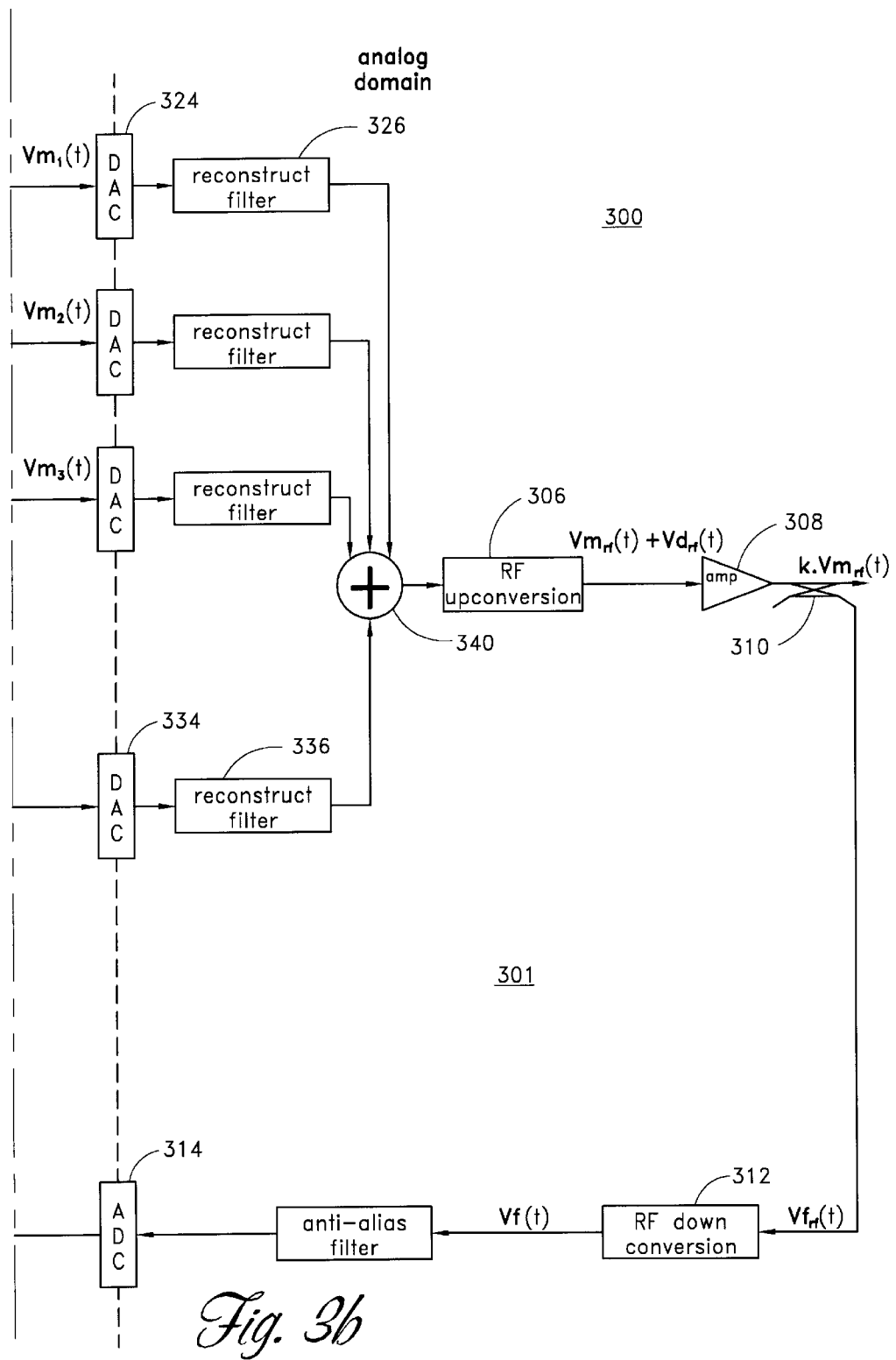

FIG. 3 illustrates an amplifier design 300 in accordance with one embodiment of the invention. As illustrated, a bank of frequency demultiplexers 320 separates a wideband digital input signal Vm(t) into multiple digital subband signals, each of which falls within a different respective frequency band of Vm(t). FIG. 3 illustrates three subbands, Vm$_1$(t), Vm$_2$(t), and Vm$_3$(t), however, one or more subbands may be used in other embodiments. An embodiment in which the wideband input signal is not divided into subbands is described separately below with reference to FIG. 6F. The bank of frequency demultiplexers 320 may be implemented with digital filters, such as finite impulse response (FIR) filters, infinite impulse response (IIR) filters, or quadrature mirror filters. Each filter may be designed so that the noise floor in each subband will be sufficiently low to meet the applicable system requirements.

Each digital subband signal is passed through a respective correction filter 322 to create a precompensated digital subband signal. The correction filters 322, which may be FIR filters or IIR filters, are configured to correct phase, gain and delay imbalances between the individual pathways. The functionality of the correction filters 322 will be discussed in greater detail below. Each of the precompensated digital subband signals is then converted to an analog subband signal using a separate digital to analog converter (DAC) 324. Each analog subband signal is then passed through a reconstruction filter 326 which has a passband that is comparable to the corresponding signal's subband width.

The digital input signal is also supplied to a digital predistortion engine 301 which creates a predistorted digital input signal Vp(t). The predistortion engine 301 includes an amplifier sampling structure (e.g., a Lange, Hybrid or Quadrature coupler) 310, an RF down conversion chain 312, a generalized analog to digital conversion (ADC) block 314, an Adaptive Control Processing and Compensation Estimator (ACPCE) block 316, and a Digital Compensation Signal Processor (DCSP) 302. Examples of devices and signal processing methods that may be used to implement these components, and particularly the DCSP 302 and the ACPCE 316, are set forth in U.S. application Ser. Nos. 09/596,142, filed Jun. 16, 2000; 09/595,988, filed Jun. 16, 2000; 6,356, 146, filed Jun. 19, 2000; 6,342,810, filed Jun. 19, 2000; and 09/596,410, filed Jun. 19, 2000, (hereinafter "the wideband applications") all of which have identical technical disclosures and all of which are hereby incorporated by reference.

The digital input signal Vm(t) is removed from the predistorted digital input signal Vp(t) (created by the predistortion engine 301) to leave the difference, which is a digital correction signal Vd(t) only. The digital input signal Vm(t) that is removed may be obtained directly or may be derived by summing the subband signals, as shown. Since the correction signal Vd(t) is supplied separately, a separate DAC 334 and a separate narrow band reconstruction filter 336 can be utilized to convert the correction signal. Accordingly, separate digital to analog pathways are used to convert the input signal Vm(t) (or $Vm_1(t)$, $Vm_2(t)$, and $Vm_3(t)$) and the correction signal. The converted analog correction signal Vd(t) and the converted analog input signal Vm(t) (or its subbands) are then combined with an analog summing junction 340 to form a composite predistorted analog input signal. The composite signal is then passed on to an RF up conversion chain 306 and a non-linear amplifier 308 (or amplifier assembly containing multiple nonlinear amplifiers) to create an output signal $k.Vm_{rf}(t)$.

The correction signal Vd(t) is usually significantly wider in bandwidth than the original input signal Vm(t) but significantly lower in power. As a result, the full dynamic range of the DAC in each pathway (subbands and correction signal) may be advantageously utilized to maximize the signal to noise ratio. In previous designs, a correction signal with a low power would have to share all of the levels of quantization of a DAC with an input signal of much higher power. Since the correction signal has a much lower power, only a relatively small number of the quantization levels of the DAC would be effectively used to convert the correction signal.

The separate narrow band reconstruction filters 326 and 336 introduce relative inconsistencies in gain, phase, and delay between the separate signals. These inconsistencies are corrected by the correction filter 322 positioned in-line along each subband signal path before the DACs. The correction filters 322 are driven by the Adaptive Control Processing and Compensation Estimator (ACPCE) 316, which adaptively generates compensation parameters for the filters based on observations of the input signal Vm(t) and the feedback signal, Vf(t). The ACPCE 316 provides corrective updates to the correction filters through a state vector $y_+(t)$ to precisely match the gain, phase, and delay of the individual subband paths. This permits substantially perfect analog reconstruction of the input signal when the multiple subbands are recombined by the analog circuitry. The functionality of the ACPCE 316 will be discussed in greater detail in the next section.

Figure 4A:
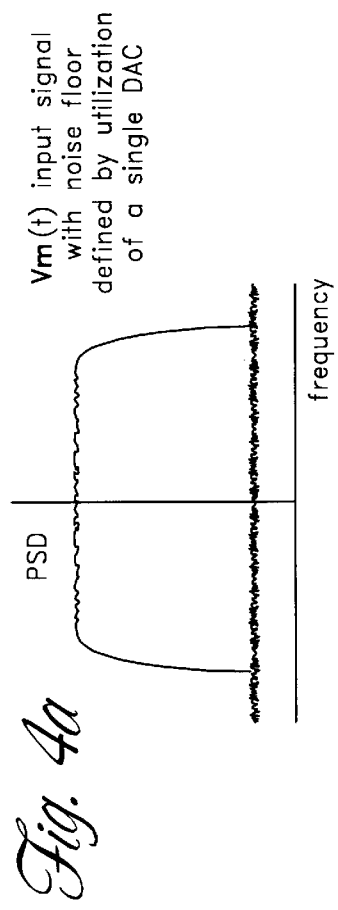
FIGS. 4A–E illustrate how the noise floor can be lowered by separately converting signals to analog along each signal path.
Figure 4C:
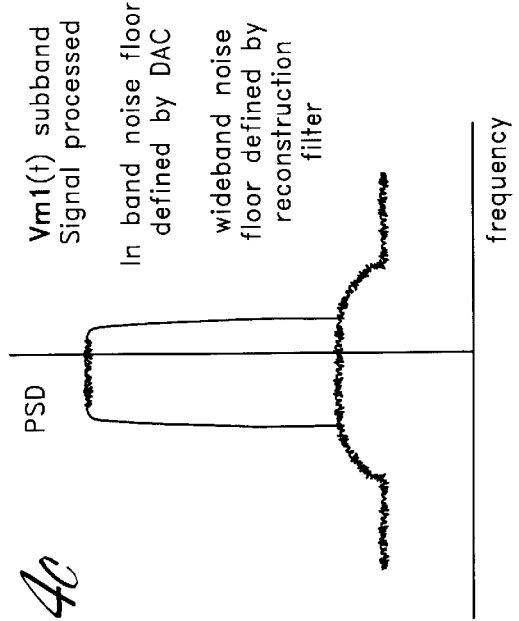
Figure 4B:
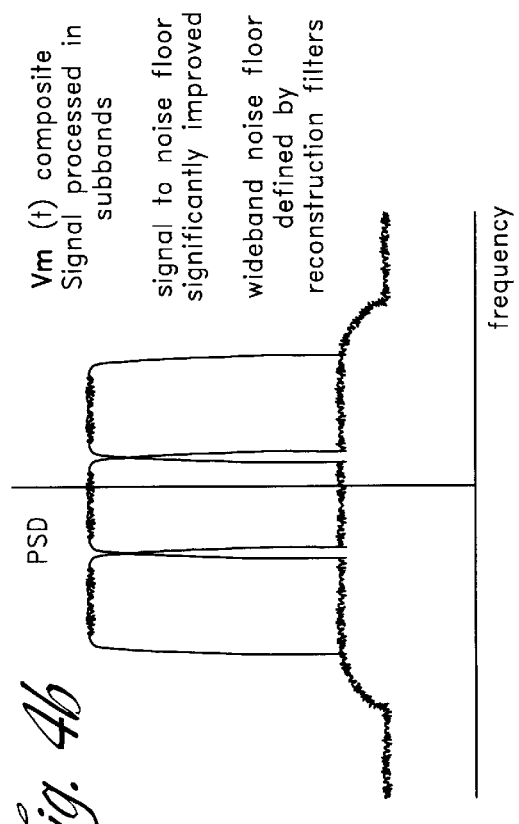

FIGS. 4A–E illustrate how separately converting each signal path lowers the noise floor. FIG. 4A shows the noise floor to signal to noise ratio that would be achieved if the entire signal were directly fed to a single (or complex pair) DAC. FIG. 4B illustrates the advantage of noise floor suppression if individual DACs are utilized for each subband. The headroom of the DAC to quantization noise floor is maximized for each subband. As a result, the inband signal to noise ratio is maximized while the utilization of tight reconstruction filters permits the out of band or wideband noise floor to be reduced by the roll-off of the reconstruction filters. An individual subband contributor is illustrated in FIG. 4C.

Figure 4D:
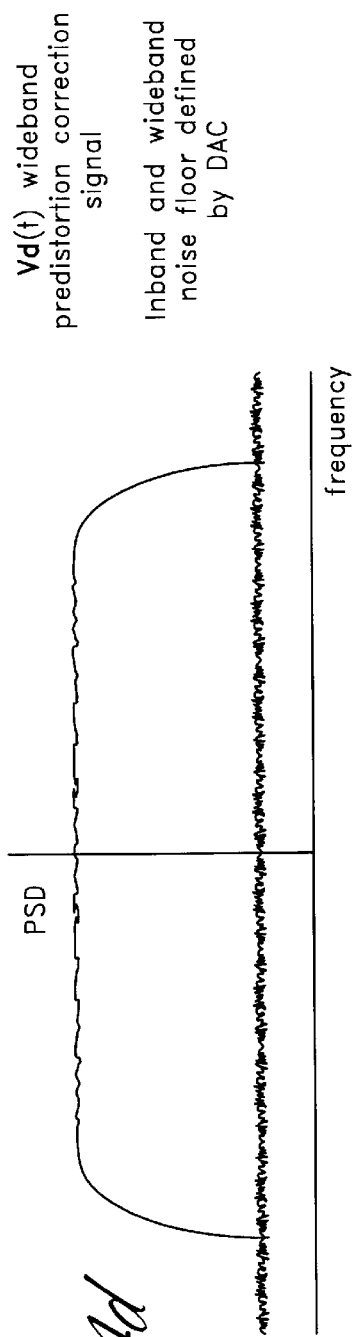
Figure 4E:
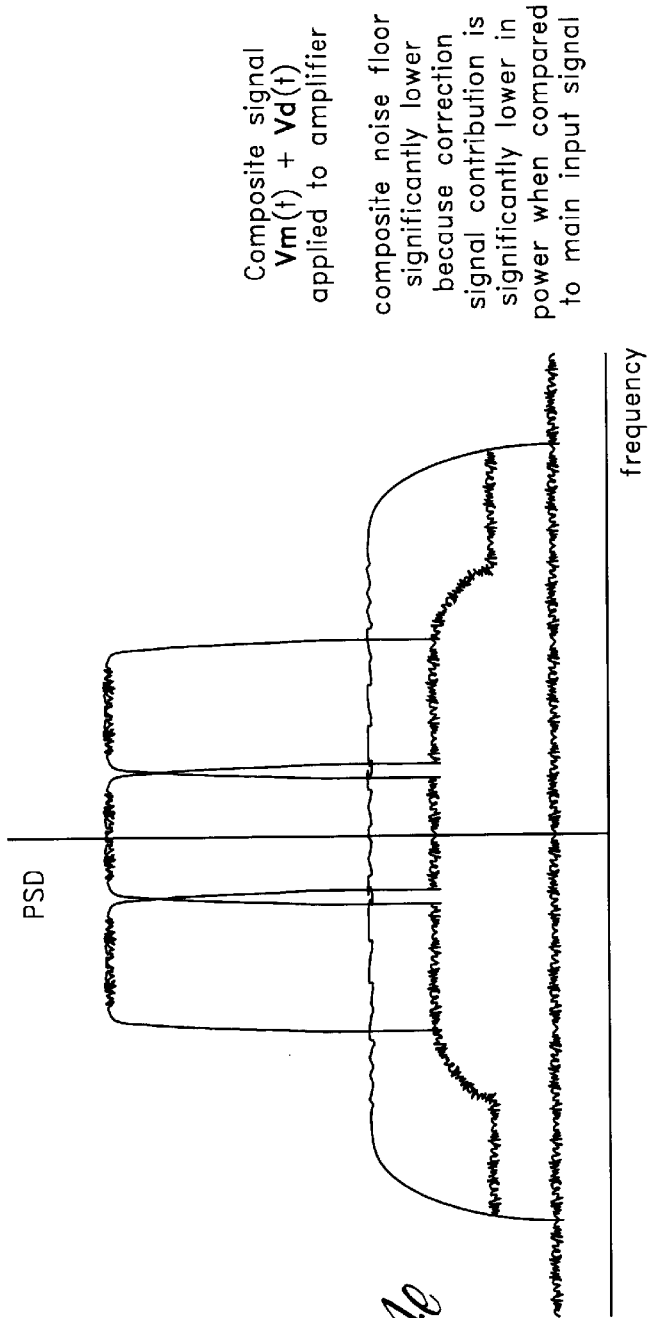

FIG. 4D illustrates the Power Spectral Density (PSD) of the correction signal Vd(t). The correction signal exhibits a lower signal to noise ratio because the signal is by nature a wideband correction signal. The noise floor is not ordinarily of concern, however, since the signal is normally 30 to 40 dB lower than the main signal. When added to the information bearing signal Vm(t) in the analog domain, the wideband noise floor is significantly lower than that of the composite signal and corrective action to lower this component's noise floor is not necessary. FIG. 4E illustrates a composite signal including the correction signal Vd(t) and the information bearing signal Vm(t). In the composite signal, the noise floor is significantly lower because the correction signal contribution is significantly lower in power when compared to the main input signal.

III. ACPCE ADAPTATION ALGORITHMS

In one embodiment, an adaption predistortion kernel, which is a configuration of the predistortion engine 301, operates in accordance with the above-referenced wideband applications. Specifically, the ACPCE captures the input signal, Vm(t), and the feedback observational signal, Vf(t), and adaptively computes DCSP predistortion correction coefficients that, when downloaded to the DCSP, will predistort the input signal to eliminate a difference between the amplifier's output signal and the input signal.

In one embodiment of the predistortion system, the input signal (decomposed into sub-bands) and the predistortion correction signal are linearly combined in the analog signal processing domain. Due to the imperfections of the analog circuitry, the recombining process is subject to a variety of errors. Specifically, gain, phase, delay, and group delay variations between the independent analog pathways can undermine the efficacy of the predistortion process. These effects can be eliminated using the correction FIR filters. To ensure that recombination occurs in an error free manner, the following analog linear imperfections should be eliminated:

i. relative gain, phase, and delay differences between the input signal's subband reconstruction filters;

ii. relative gain, phase, and delay difference between the recombined input signal and the predistortion correction signal component;

iii. group delay variation differences between the individual subband reconstruction filters; and iv. group delay variation for the predistortion reconstruction filter.

Correction coefficients to eliminate these effects are easily computed by the addition of a few simple algorithms to the existing algorithm set as set forth in the wideband applications. The result of these new simple algorithms when executed by the ACPCE will be a set of linear correction FIR filter coefficients that are downloaded from the ACPCE to the correction filters to simply balance each subband signal with respect to the others and the predistortion correction signal pathway. These simple algorithm extensions are discussed in the following sections.

A. Input Subband Gain, Phase, and Delay Differences

The output of the analog subband recombination process may be described by Equation (1):

$$Vm_a(t) = \alpha_1 e^{j\beta_1}(\delta(t+\tau_1) \otimes h_1(t) \otimes V_1(t)) + \alpha_2 e^{j\beta_2}(\delta(t+\tau_2) \otimes h_2(t) \otimes V_2(t)) + \ldots$$

where $Vm_\alpha(t)$ represents the analog recombination of $Vm(t)$ the input signal and $\alpha, \beta, \tau$ and $h(t)$ are the independent analog gain, phase, delay and impulse response of the individual analog subband pathways. Assuming that no loss of signal information occurs in the process of creating subbands, then ideally Equation (2) holds.

$$Vm(t) = Vm_\alpha(t) = V_1(t) + V_2(t) + \ldots$$

To ensure that Equation (2) is satisfied, each of the independent gain, phase, and delay differences are estimated and corrected so that the recombination process is accurate and faithfully regenerates the input signal $Vm(t)$. This is achieved very easily by performing a simple correlation between each subband component and the observed feedback signal. The correction filter coefficients for each subband are readily identified from the resulting individual correlation peaks. Each peak identifies the bulk gain, phase, and delay incurred by each subband. When provided with this information, it is a simple and direct computation to compute the coefficients of a FIR filter that equalize these differences between each subband pathway. Once this has been achieved by the ACPCE, the correct coefficients can be downloaded to the correction FIR filters 322.

B. Predistortion Correction Signal Gain, Phase, and Delay Difference

In a similar manner to the previous subsection, the gain, phase, and bulk delay of the predistortion correction pathway can be readily identified or estimated by a simple correlation. This particular estimation has a fairly wide tolerance. Provided that the estimation falls within ninety degrees of phase and the overall absolute delay is matched to the subband pathways within the span of the predistortion engine's memory kernel, the normal predistortion adaption algorithm will immediately respond and correct any residual estimation error by compensating within the DCSP coefficients. Initial estimates of the correction can be formulated by applying a bulk gain, phase and delay shift equally to all sub-band correction coefficients to ensure that the recombined input signal is aligned with the predistortion correction signal. Alternatively, the correction can be convolved into the normal starting conditions of the adaption kernel. For simplicity, the foremost option is usually preferred.

C. Predistortion Reconstruction Filter Group Delay Variation Imperfection

Errors incurred due to the predistortion correction signal being independently reconstructed from the input signal via an external analog filter will automatically be corrected via the ACPCE's predistortion kernel. Thus no additional computation is required.

D. Subband Reconstruction Filter Group Delay Variation Imperfections

Subsection A above discusses the elimination of the bulk gain, phase and delay differences between the individual subband signal pathways, however group delay variations between the individual reconstruction filters utilized in the analog domain will also adversely affect the recombination process and eventually the predistortion process. These effects can also be readily eliminated through the correction FIR filter structure.

Figure 5:
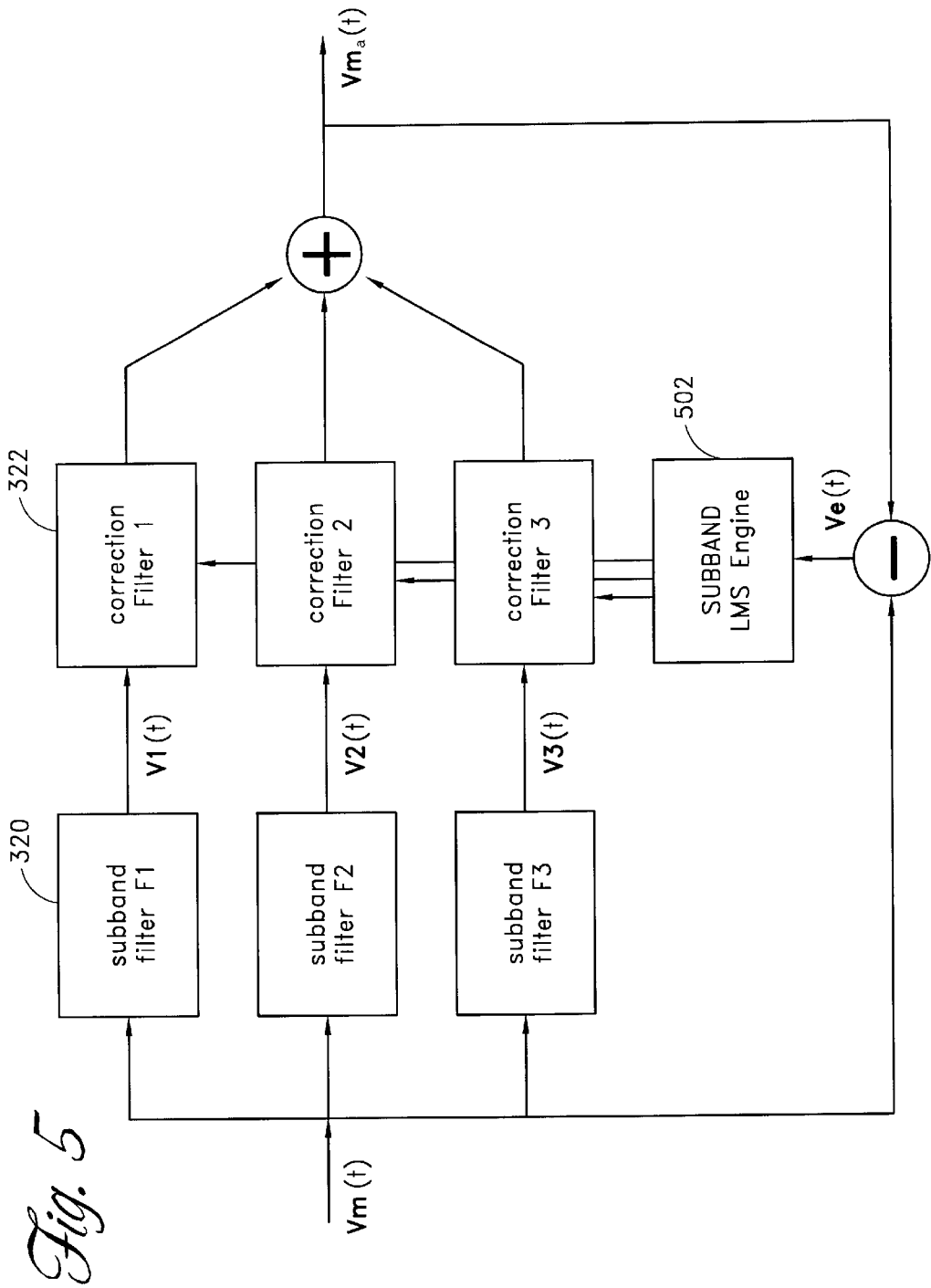
FIG. 5 illustrates how extended FIR filter coefficients can be computed by utilizing an LMS subband equalizer.

As illustrated in FIG. 5, computation of the extended FIR filter coefficients is readily achieved by utilizing a least mean squares (LMS) subband equalizer 502 in accordance with known techniques. The update of the correction FIR filter coefficients can be driven by a typical LMS update engine in accordance with Equation (3):

$$N_{taps} = O_{taps} + \Delta V_e V_d \tag{3}$$

In equation (3), $N_{taps}$ defines the new taps, $O_{taps}$ the old or previous FIR filter taps, and delta is the update gain associated with the error signal $V_e$ for a specific data set $V_d$. It is important to note that $V_d$ represents a set of data upon each of the signal branch FIR filters. Equation (4) provides a typical matrix partition for Equation (3) in this application.

$$\begin{bmatrix} N1_{taps} \\ N2_{taps} \\ N3_{taps} \end{bmatrix} = \begin{bmatrix} O1_{taps} \\ O2_{taps} \\ O3_{taps} \end{bmatrix} + \Delta V_e \begin{bmatrix} V_{d1} \\ V_{d2} \\ V_{d3} \end{bmatrix} \tag{4}$$

IV. ENHANCEMENTS AND VARIATIONS

Figures 1, 6A:
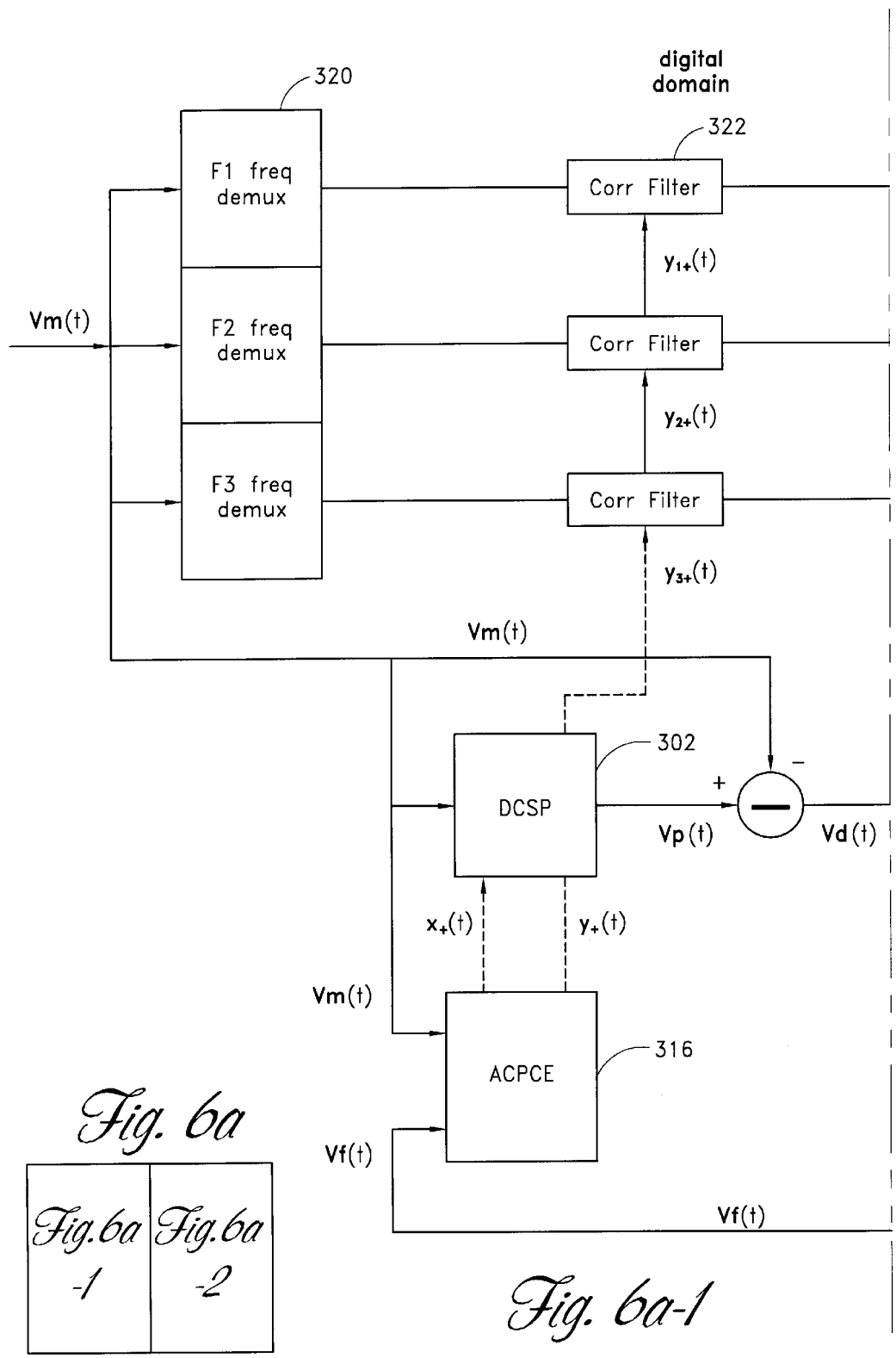
FIGS. 6A–G illustrate a number of additional and alternative embodiments.
Figures 2, 6A:
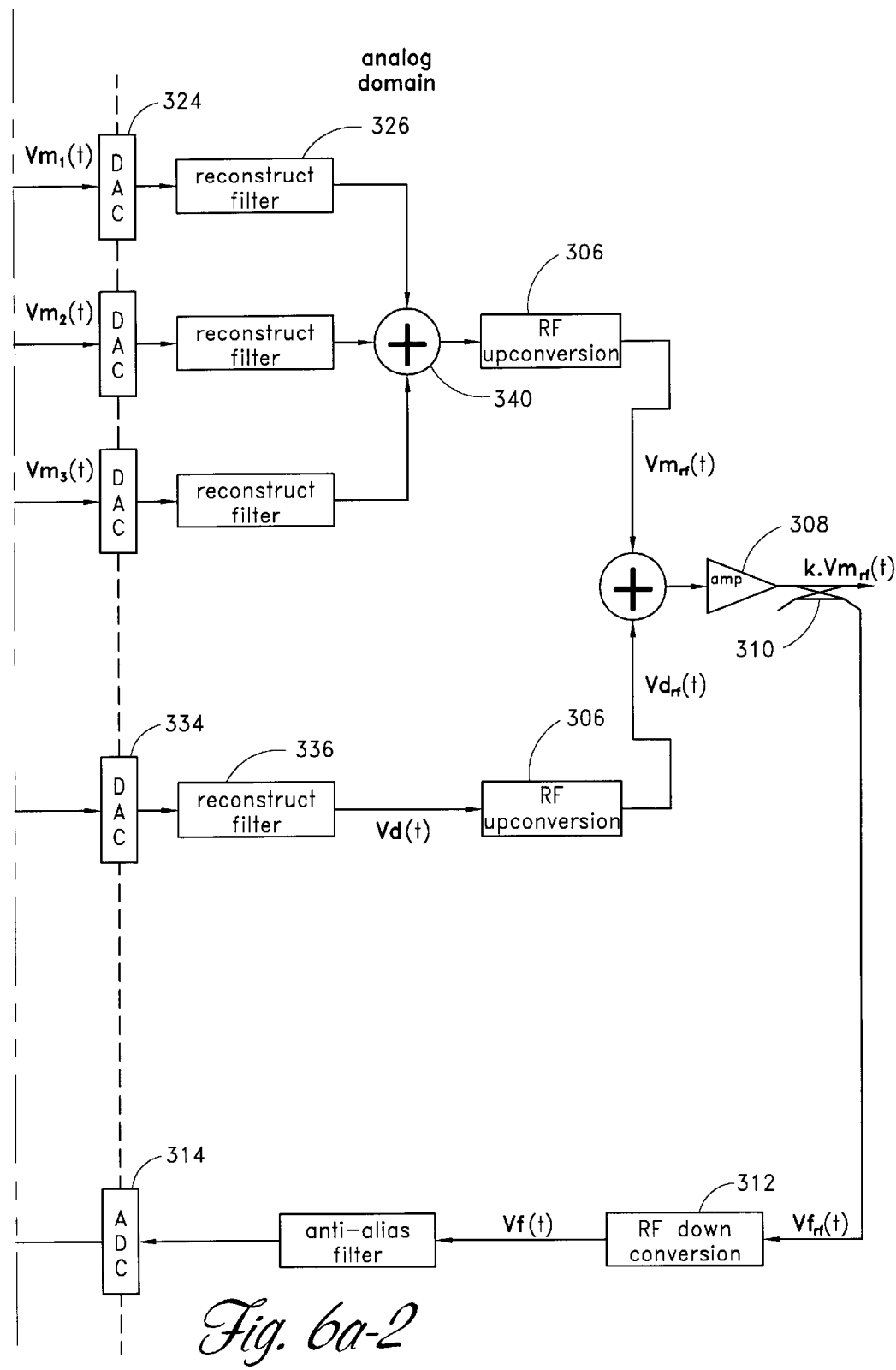

In certain applications, phase noise associated with RF modulation and upconversion processes causes additional tight filtering requirements to undermine the linearization process. FIG. 6A illustrates an extension to the design that permits RF combining as opposed to low IF or baseband combining to be utilized. This approach also permits suppression of wideband phase noise by the upconvertor filtering in addition to wideband quantization effects. Also illustrated in FIG. 6A is a configuration in which the digital input signal $Vm(t)$ is supplied directly to the predistortion engine 301.

Figures 1, 6B:
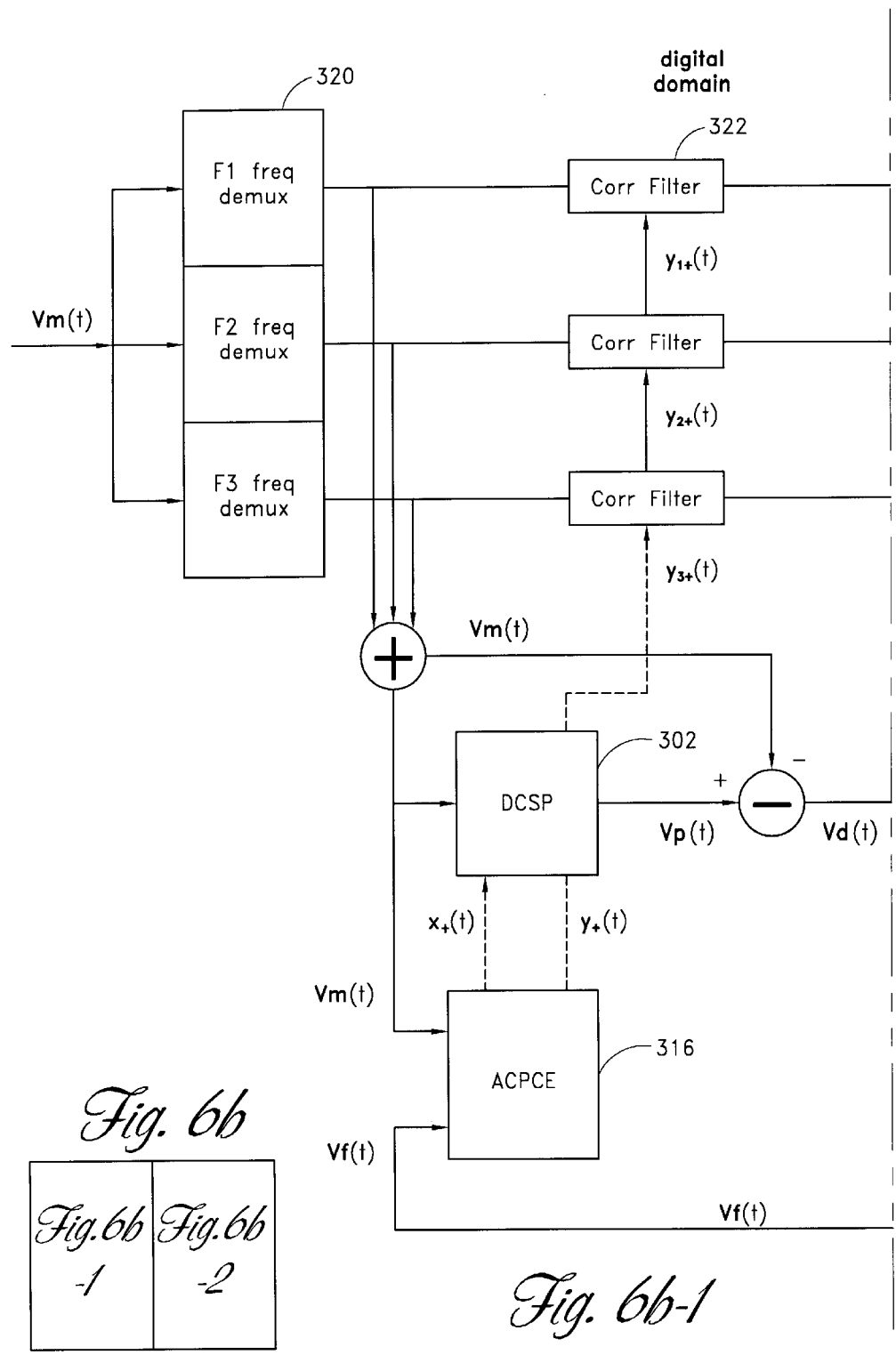
Figures 2, 6B:
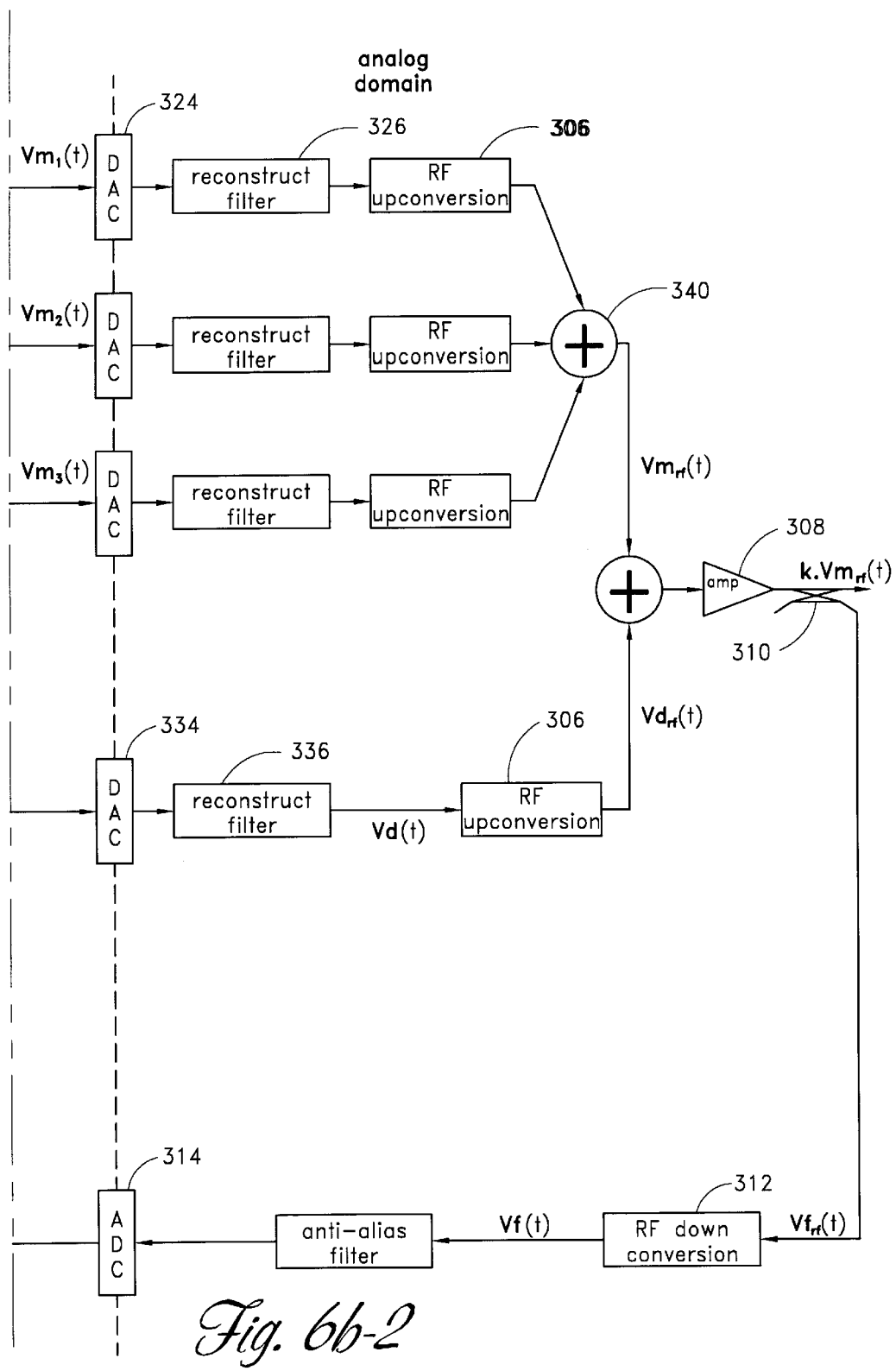

As illustrated in FIG. 6B, in critical applications, where phase noise is a dominating factor in contributing to wideband noise, the design can be extended to utilize an individual upconversion and modulation process for each subband signal.

In certain applications the input wideband signal may not exercise all subbands yet each subband may be subject to data flow on a moments notice. During these periods of inactivity the RF components and analog baseband components can drift. Accurate tracking of these changes can be accomplished by injecting antiphase sequences either during transmission or non-transmission events. Antiphase sequences are specially designed sequences that cancel prior to PA amplification in perfectly balanced signal processing chains, as set forth in U.S. Pat. No. 5,990,734, the disclosure of which is hereby incorporated by reference. If perfect balance is not exhibited, the ACPCE is provided with immediate error information in the feedback signal to rectify the situation.

Figure 6C:
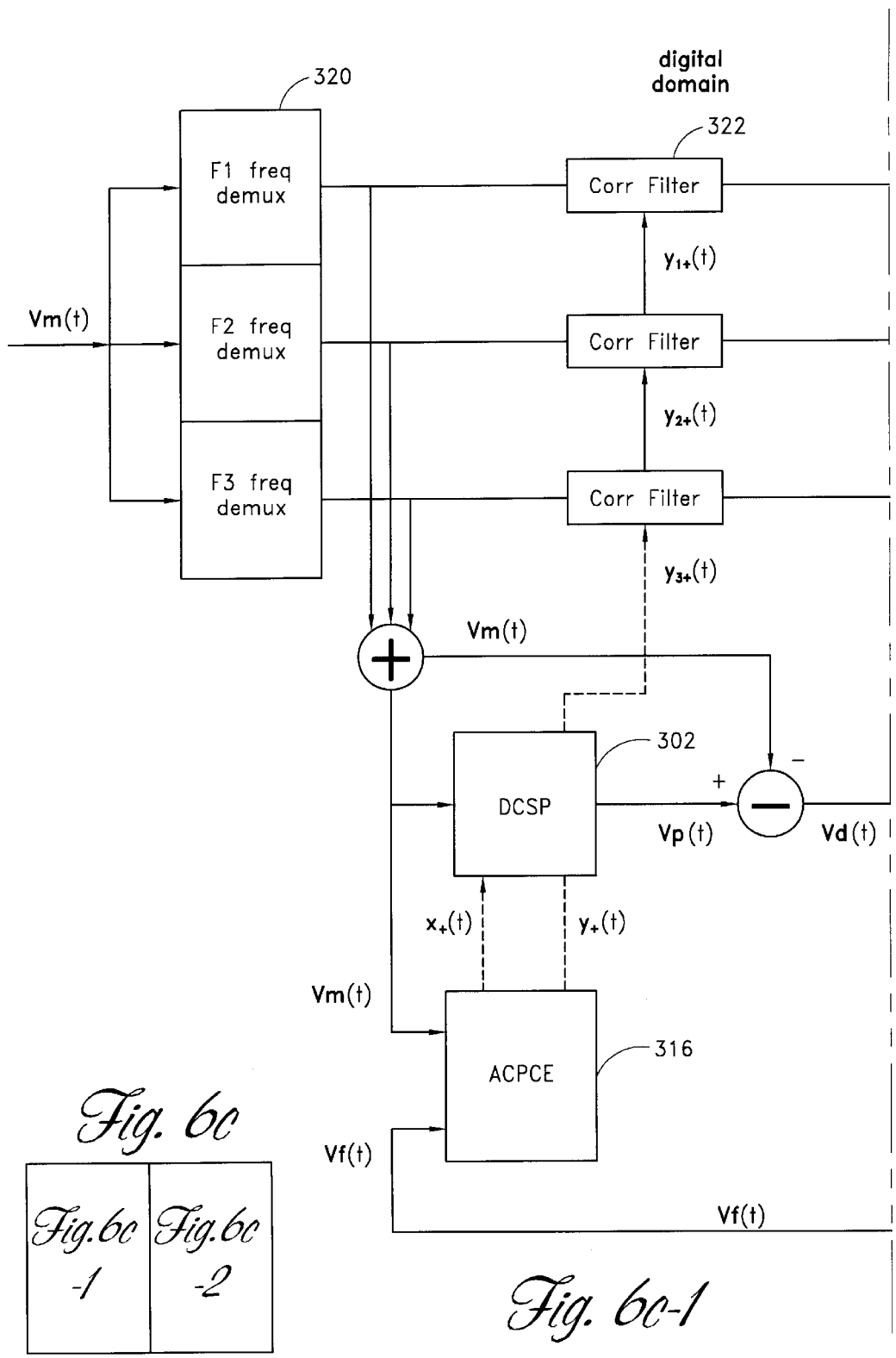
Figure 1:
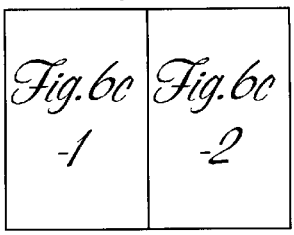
Figures 2, 6C:
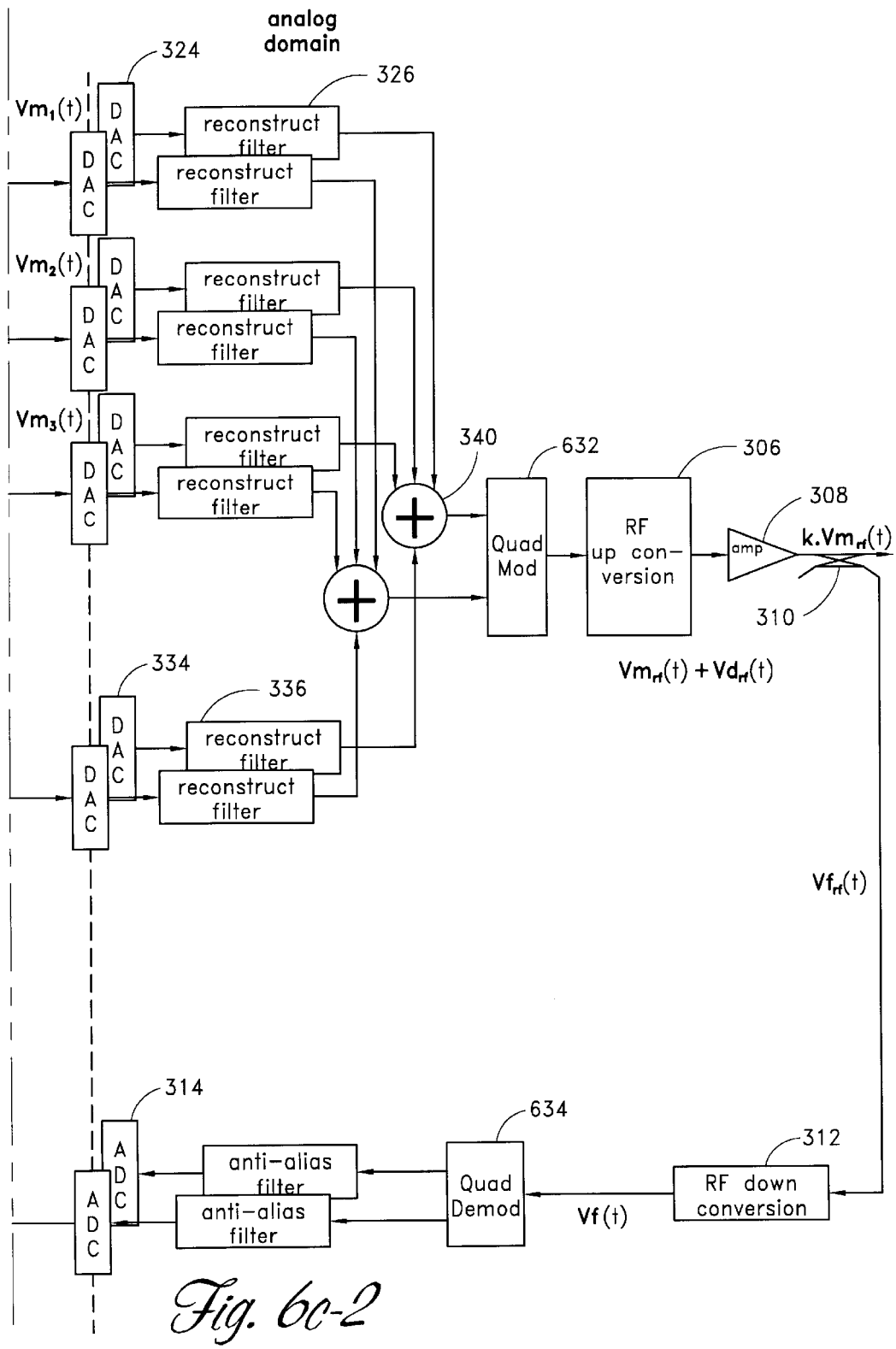

The designs presented above have shown a single data pathway for each subband to ensure clarity. In practice, these pathways may be real or complex, and may be utilized in conjunction with either quadrature modulator baseband to IF or RF conversion or direct IF conversion. These and other variants will be apparent to those skilled in the art. A complex quad mod design is shown in FIG. 6C. The design in FIG. 6C includes a quadrature modulator 632 and a quadrature demodulator 634.

Figures 1, 6D:
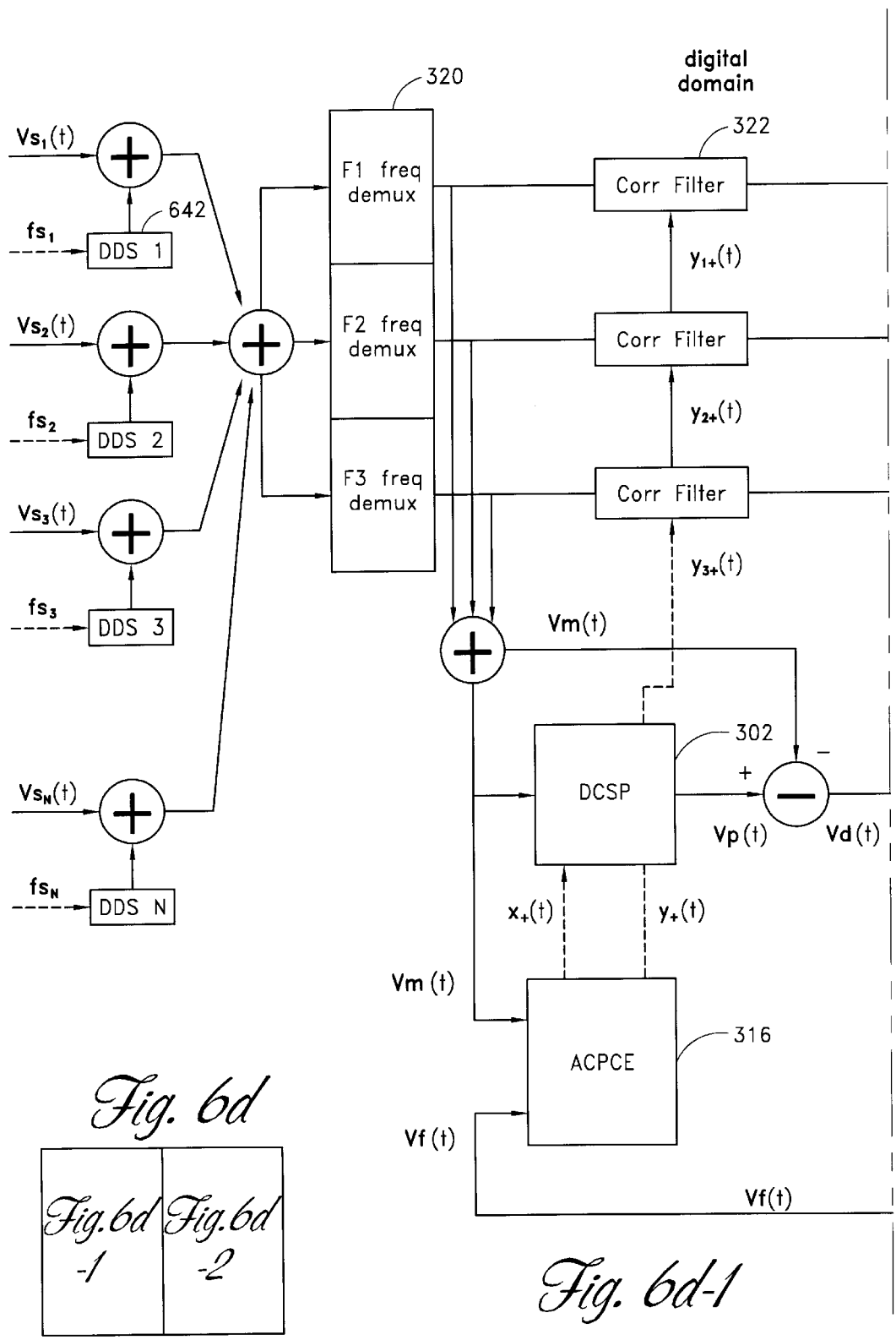
Figures 2, 6D:
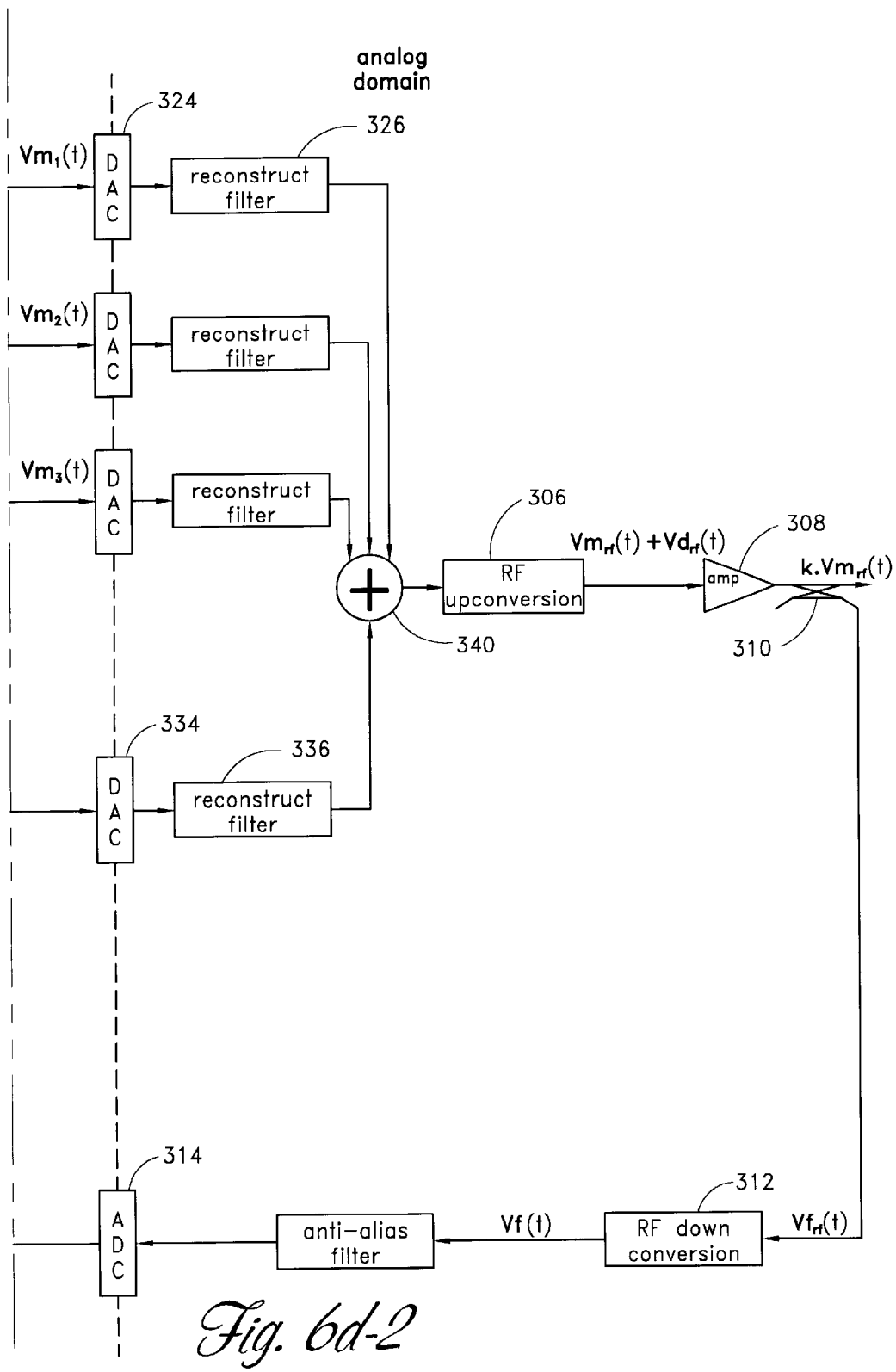
Figures 1, 6E:
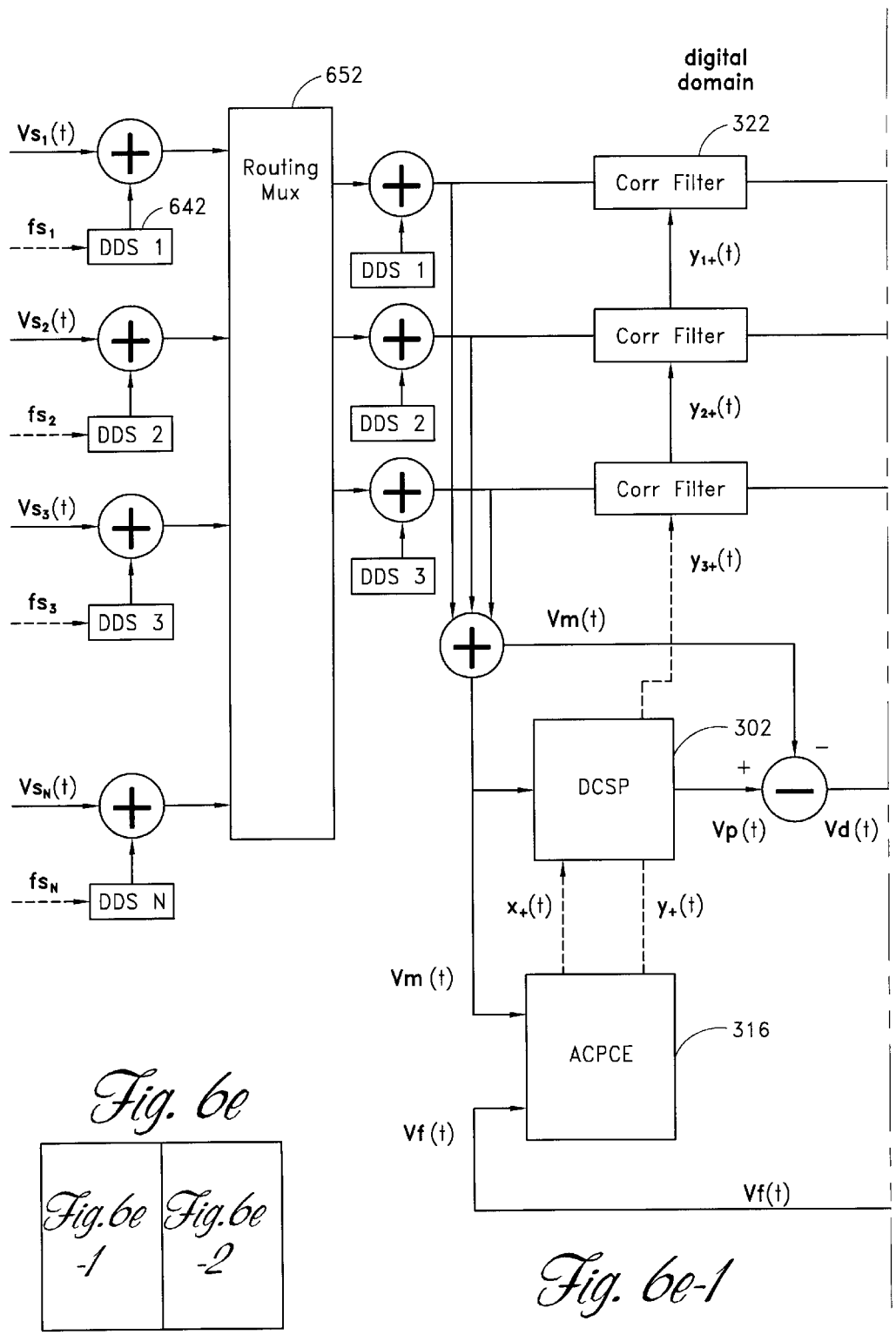
Figures 2, 6E:
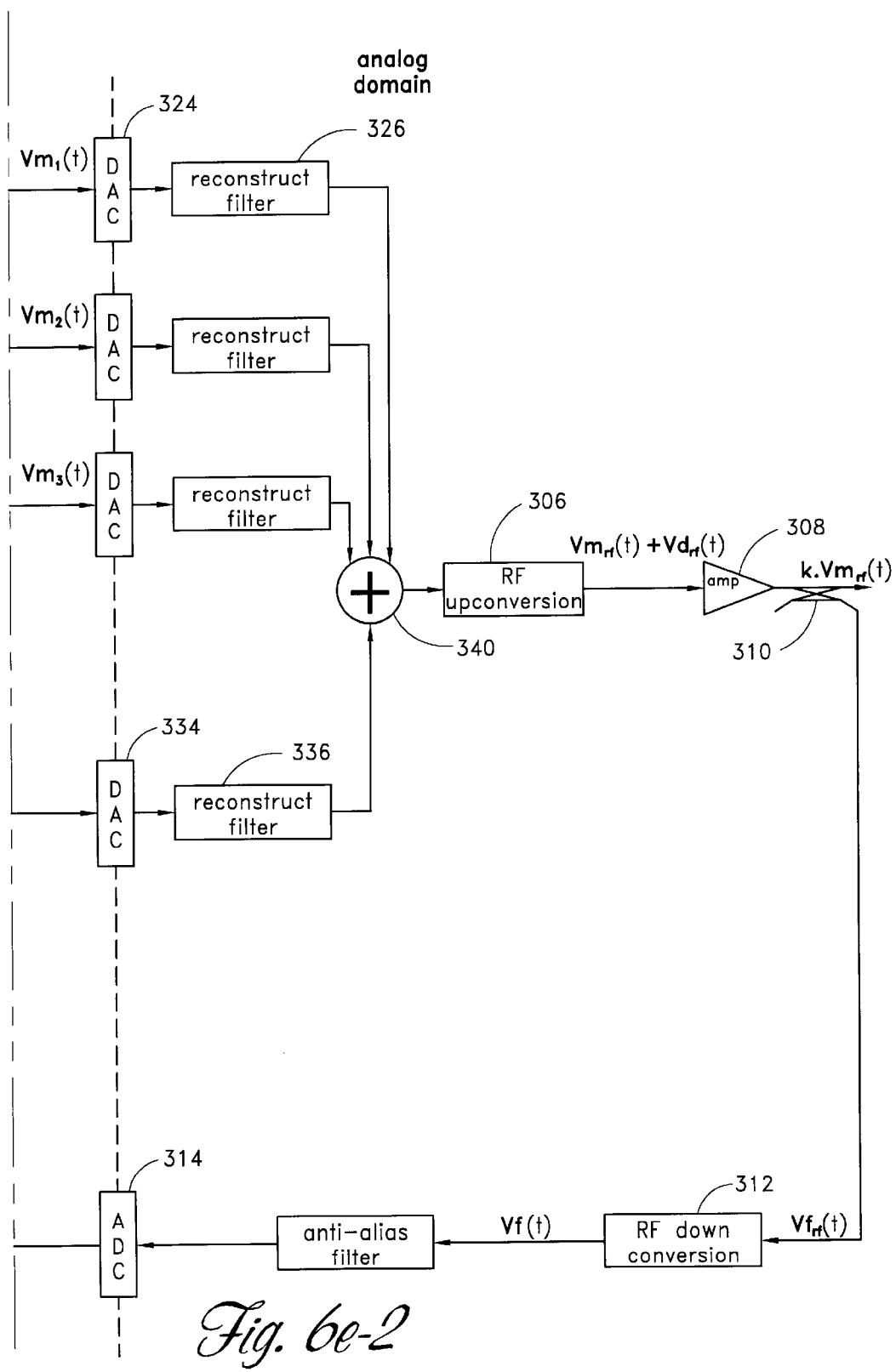

Alternate versions of the design may be envisioned when multiple input signals are supplied in conjunction with command signals that define which subband the input signal should be placed within. FIG. 6D illustrates a design where digital synthesizers (DDS) 642 are utilized to assist in the construction of a single composite wideband signal that is fed to the subband filter bank which then demultiplexes the wideband signal in accordance with the previously described mode of operation. FIG. 6E illustrates a further variation where a routing multiplexer (mux) 652 is utilized to form the individual subbands rather than a filter bank.

Another extension that can extend the design's overall operating bandwidth is to use a further modification to the predistortion architecture that permits the correction signal's bandwidth to be minimized. In this embodiment, the predistortion engine is utilized to create an identical distortion signal to that created by the main amplifier 308. This signal is then subtracted from the main amplifier's output signal. The approach works because in ultra wideband designs the normal "inverted" correction signal occupies about 7 to 11 times the input signal bandwidth. This approach permits the corrective action to occupy a bandwidth that is only about 3 to 5 times the input signal bandwidth. The downside is that the additional amplifier tends to reduce system efficiency.

Figures 2, 6F:
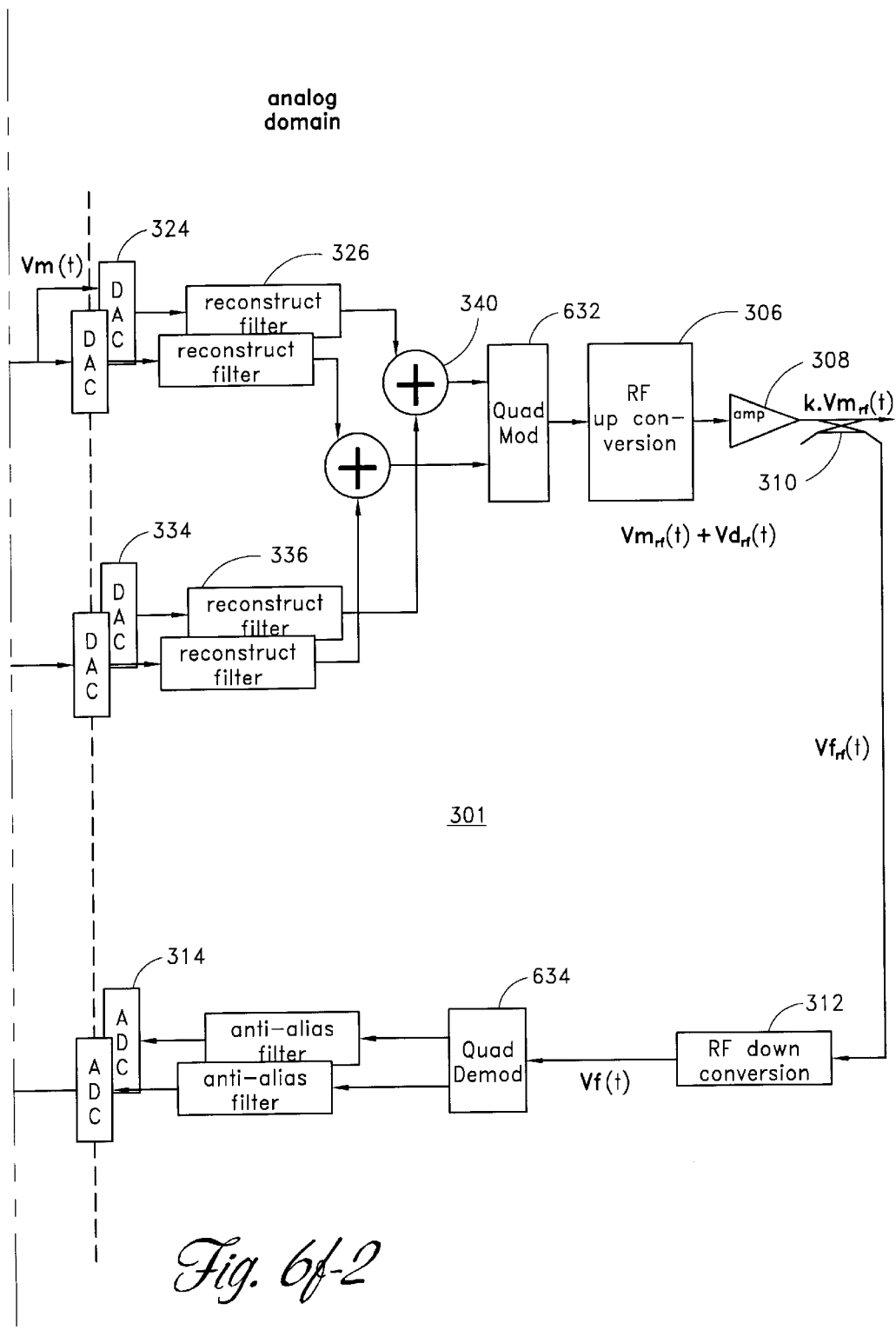

FIG. 6F illustrates a lower cost embodiment of the invention that trades a reduction in overall noise suppression performance against the number of DACs that are actually used. In this embodiment only two data pathways need be utilized to generate the overall transmit signal $Vm_{rf}(t)$. The upper data pathway is constructed utilizing a correction FIR filter 322 that permits the input signal to be passed directly to the output DACs 314. The bandwidth used by the reconstruction filters 326 along this path is tight and strictly limited directly to the input signal $Vm(t)$ or composite signal's bandwidth. The second pathway is utilized by the predistortion engine 301 to supply a wide bandwidth predistortion signal $Vp(t)$ but lower power signal to the external analog summing junction 340. The reconstruction filter 336 in this scenario is defined by the predistortion signal's bandwidth, which is ordinarily wider than the input signal bandwidth by a factor of about three to nine. This cost reduced embodiment can be utilized in all of the aforementioned configurations including baseband, IF or RF combining with direct conversion, or digital IF configurations.

Figures 1, 6G:
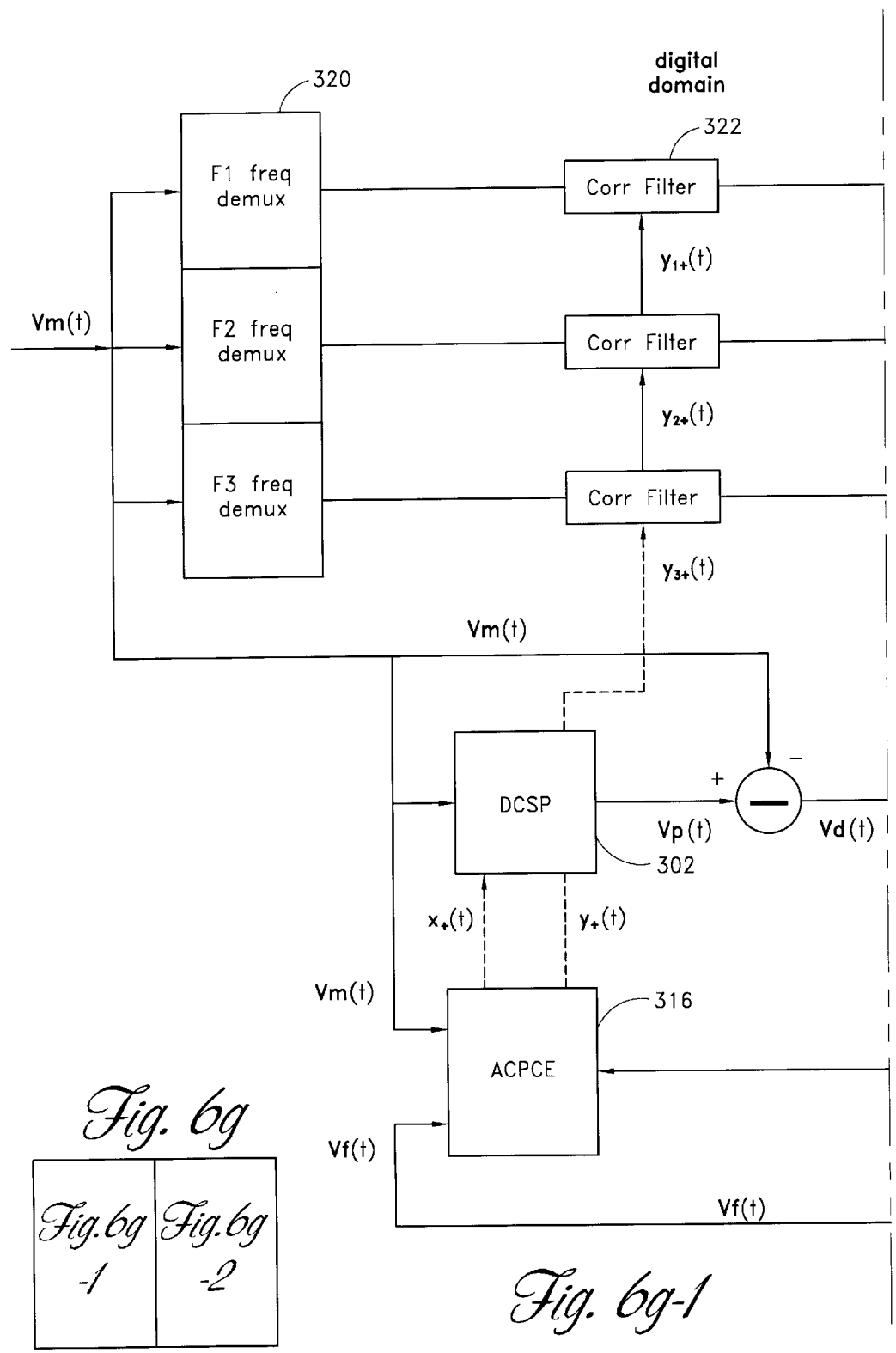
Figures 2, 6G:
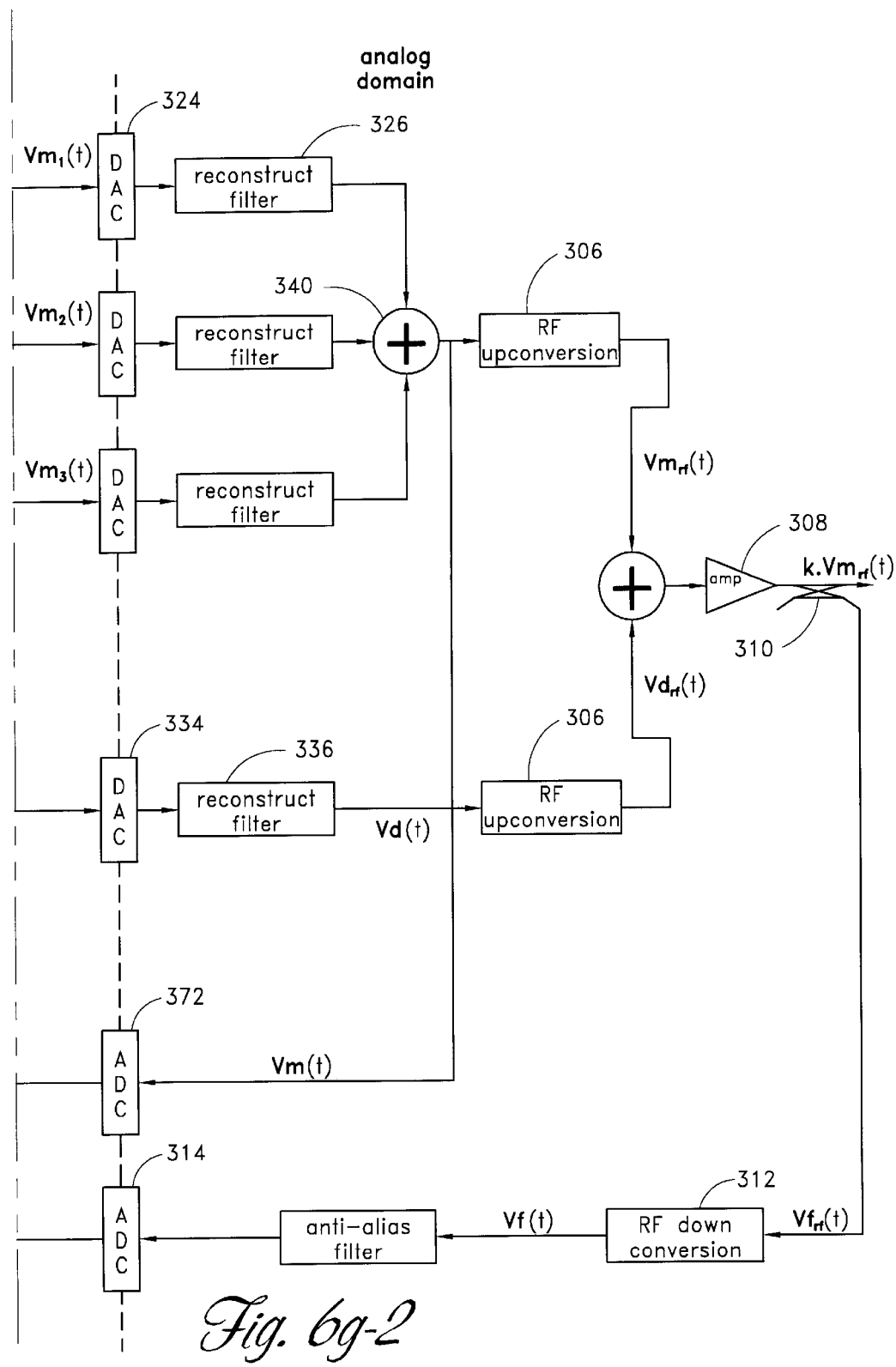

FIG. 6G illustrates a configuration in which the ACPCE creates the state vector $y_+(t)$ (used to configure the correction filters) based upon the reconstructed and combined input signal $Vm(t)$ rather than the amplifier output $k \cdot Vm_{rf}(t)$. The reconstructed and combined input signal is passed through an ADC 672 and then on to the ACPCE 316. As illustrated, the digital input signal $Vm(t)$ may be supplied directly to the predistortion engine 301 rather than using a combination of the subbands.

V. HARDWARE IMPLEMENTATION

Figure 7:
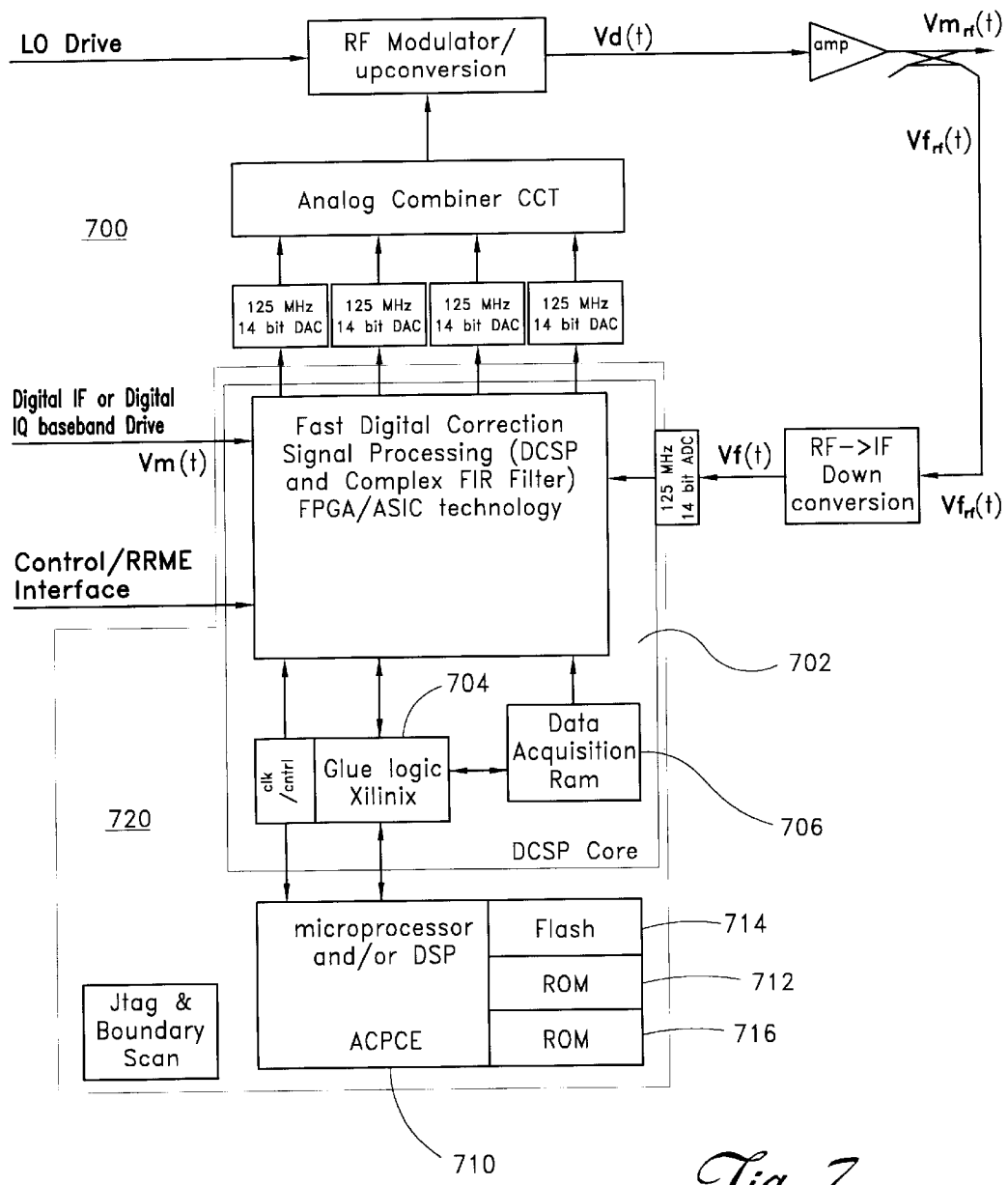
FIG. 7 illustrates a hardware implementation according to one embodiment.

FIG. 7 illustrates an example circuit 700, which may be used to implement the above-described embodiments of the invention. A DCSP core 702 preferably includes wideband predistortion architecture, frequency subband demultiplexers, multiple DAC drivers, and a control interface. Due to the fast signal processing requirements of the DCSP 302, the DCSP core is preferably implemented using dedicated hardware such as a field programmable gate array (FPGA) or dedicated silicon in an ASIC. The ASIC or FPGA may need a modest amount of 'glue logic' 704 to interface the DCSP to a standard microprocessor or DSP 710 that implements the ACPCE 316, which computes and delivers updated DCSP coefficients.

The ACPCE 316 preferably operates in non-real time such that a general purpose DSP or microprocessor 710 may be used, such as a TMS320C54, a TMS320C60, a TMS320C40, an ARM 7, or a Motorola 68000. This processor 710 is preferably augmented with non-volatile ROM 712 for both program storage and factory installed default parameters. Both ROM 712 and Flash ROM 714 are particularly suitable for this purpose. As with most DSP or microprocessor designs, a proportional amount of RAM 716 is used for general purpose program execution.

The DCSP core 702 can also provide an interface to a data storage RAM 704 where sets of observed amplifier input signal sequences may be stored prior to utilization by the ACPCE. This RAM 704 may reside on the ASIC chip. The ACPCE provides updated and/or adapted compensation parameters to the DCSP core 702 on a regular basis through the RAM structure 704. A separate RAM structure, however, may be used for this purpose. The DCSP is provided fast access to the compensation parameters through this RAM structure. As digital signal processors evolve in speed, the DCSP process may be performed by a processor such as a TMS320C60 from Texas Instruments or a SHARC processor from Analog Devices.

Future evolution of the design will permit the DSP/microprocessor core and the ASIC/FPGA to be integrated onto a single ASIC chip. ARM7, TEAK, OAK and ARC DSP and microprocessor cores are particularly suited to this approach and will yield a one chip solution if on board RAM, ROM and Flash ROM are provided.

A direct conversion up conversion baseband to RF conversion is utilized combined with a RF to IF down conversion which is appropriately sampled to capture IF data and followed by a digital quadrature conversion to complex baseband. To those skilled in the art it is apparent that this embodiment could readily utilize direct conversion for both RF up and down conversion or utilize digital to IF conversion followed by IF to RF and vice versa for the frequency translation process.

VI. CONCLUSION

This invention is applicable to any digital linearized amplifier technology. Predistortion is utilized here as an exemplary design, and is not intended to limit the scope of the invention. Application to Cartesian, and digital linearized feedforward designs is possible. The approach permits digital amplifier designs to evolve which permit bandlimited wideband RF signals, optical signals or IF signals to be successfully amplified. The invention can be used for multiple signals and for any modulation scheme or combination of modulations. Where multiple signals are amplified they can each have any modulation type.

Although the invention has been described in terms of certain embodiments, other embodiments that will be apparent to those of ordinary skill in the art, including embodiments which do not provide all of the features and advantages set forth herein, are also within the scope of this invention. Accordingly, the scope of the invention is defined by the claims that follow. In method claims, reference characters are used for convenience of description only, and do not indicate a particular order for performing a method.

What is claimed is:

1. A method for converting a digital input signal to an analog input signal for input to a power amplifier, the method comprising:

separating the input signal into a plurality of digital subband signals;

processing the digital subband signals to generate digital precompensated subband signals;

converting the digital precompensated subband signals to analog form using subband-specific digital to analog converters to generate analog precompensated subband signals;

combining the analog precompensated subband signals;

generating an analog correction signal based at least upon the digital input signal; and combining the analog correction signal with the analog precompensated subband signals;

wherein generating an analog correction signal comprises:

generating a predistorted digital input signal based at least upon the input signal and an output signal from the amplifier;

taking a difference between the predistorted digital input signal and the digital input signal to generate a digital correction signal; and converting the digital correction signal to analog form.

2. The method of claim 1, wherein each of the analog precompensated subband signals is generated by further passing the output of each subband-specific digital to analog converter through a separate narrow band reconstruction filter.

3. The method of claim 1, wherein the digital input signal is a wideband signal.

4. The method of claim 1, wherein each of the plurality of digital subband signals corresponds to a different respective frequency band.

5. The method of claim 1, wherein the input signal is separated into three digital subband signals.

6. A system for converting a digital input signal to an analog input signal for an analog amplifier, the system comprising:

a first circuit configured to separate the digital input signal into a plurality of digital subband input signals;

a plurality of digital to analog converters, wherein each of the plurality of digital to analog converters is configured to convert one of the digital subband input signals to an analog subband input signal; and a second circuit configured to combine the analog subband input signals to form the analog input signal;

wherein the first circuit comprises a plurality of frequency demultiplexers.

7. The system of claim 6, wherein each of the frequency demultiplexers is selected from the group consisting of: a finite impulse response filter, an infinite impulse response filter, and a quadrature mirror filter.

8. The system of claim 6, wherein the first circuit comprises a plurality of bandpass filters.

9. The system of claim 6, wherein the first circuit comprises a plurality digital synthesizers.

10. The system of claim 6, further comprising a plurality of correction filters, wherein each correction filter is connected between the first circuit and one of the digital to analog converters, and wherein each correction filter is configured to modify at least one of the gain, the phase, and the delay of one of the digital subband input signals.

11. The system of claim 6, wherein the digital input signal is a wideband signal.

12. The system of claim 6, wherein each of the plurality of digital subband input signals corresponds to a different respective frequency band.

13. The system of claim 6, wherein the first circuit separates the digital input signal into three digital subband input signals.

14. A system for predistorting a digital input signal to compensate for nonlineanties in an amplification process, the system comprising:

a first circuit which adaptively processes the digital input signal to compensate for at least one type of distortion introduced by the amplification process, to thereby generate a predistorted digital input signal;

a second circuit which substantially removes the digital input signal from the predistorted digital input signal to generate a digital correction signal;

a digital to analog converter which converts the digital correction signal to analog form to generate an analog correction signal;

a third circuit which combines the analog correction signal with at least one analog signal representing the digital input signal, to thereby generate an analog predistorted input signal; and a fourth circuit which generates said at least one analog signal representing the digital input signal, the fourth circuit comprising multiple signal processing paths which correspond to respective subbands of the digital input signal, each signal processing path comprising a subband-specific digital to analog converter, wherein each signal processing path of the fourth circuit further comprises:

a frequency demultiplexer which generates a digital subband signal from the digital input signal; and a digital filtering circuit which adaptively modifies the digital subband signal to compensate for gain, phase, and delay variations.

15. The system as in claim 14, wherein substantially an entire dynamic range of the digital to analog converter which converts the digital correction signal is used to convert the digital correction signal to analog form.

16. The system as in claim 14, wherein the digital to analog converter which converts the digital correction signal is a complex pair digital to analog converter.

17. The system of claim 14, wherein the digital input signal is a wideband signal.

18. A system for converting a digital input signal to an analog input signal for an analog amplifier, the system comprising:

a first circuit configured to separate the digital input signal into a plurality of digital subband input signals;

a plurality of digital to analog converters, wherein each of the plurality of digital to analog converters is configured to convert one of the digital subband input signals to an analog subband input signal; and a second circuit configured to combine the analog subband input signals to form the analog input signal;

wherein the first circuit comprises a plurality digital synthesizers.

19. The system of claim 18, wherein the first circuit comprises a plurality of frequency demultiplexers.

20. The system of claim 19, wherein each of the frequency demultiplexers is selected from the group consisting of: a finite impulse response filter, an infinite impulse response filter, and a quadrature mirror filter.

21. The system of claim 18, wherein the first circuit comprises a plurality of bandpass filters.

22. The system of claim 18, wherein the first circuit further comprises a routing multiplexer.

23. The system of claim 18, further comprising a plurality of correction filters, wherein each correction filter is connected between the first circuit and one of the digital to analog converters, and wherein each correction filter is configured to modify at least one of the gain, the phase, and the delay of one of the digital subband input signals.

24. The system of claim 18, wherein the digital input signal is a wideband signal.

25. The system of claim 18, wherein each of the plurality of digital subband input signals corresponds to a different respective frequency band.

26. The system of claim 18, wherein the first circuit separates the digital input signal into three digital subband input signals.

27. A system for converting a digital input signal to an analog input signal for an analog amplifier, the system comprising:
- a first circuit configured to separate the digital input signal into a plurality of digital subband input signals, each of which has a bandwidth that is lower than the bandwidth of the digital input signal;
- a plurality of digital to analog converters, wherein each of the plurality of digital to analog converters is configured to convert one of the digital subband input signals to an analog subband input signal; and
- a second circuit configured to combine the analog subband input signals to form the analog input signal;
- wherein the first circuit comprises a routing multiplexer.

28. The system of claim 27, further comprising a plurality of correction filters, wherein each correction filter is connected between the first circuit and one of the digital to analog converters, and wherein each correction filter is configured to modify at least one of the gain, the phase, and the delay of one of the digital subband input signals.

29. The system of claim 28, wherein the first circuit further comprises a plurality digital synthesizers.

30. The system of claim 27, wherein the digital input signal is a wideband signal.

31. The system of claim 27, wherein each of the plurality of digital subband input signals corresponds to a different respective frequency band.

32. The system of claim 27, wherein the first circuit separates the digital input signal into three digital subband input signals.

* * * * *